United States Patent
Yoshikawa et al.

(10) Patent No.: US 12,495,596 B2
(45) Date of Patent: Dec. 9, 2025

(54) SEMICONDUCTOR DEVICE AND MANUFACTURING METHOD

(71) Applicant: FUJI ELECTRIC CO., LTD., Kanagawa (JP)

(72) Inventors: Koh Yoshikawa, Matsumoto (JP); Kosuke Yoshida, Matsumoto (JP); Nao Suganuma, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 616 days.

(21) Appl. No.: 17/892,157

(22) Filed: Aug. 22, 2022

(65) Prior Publication Data

US 2023/0081512 A1    Mar. 16, 2023

(30) Foreign Application Priority Data

Sep. 15, 2021 (JP) .................................. 2021-150094
Apr. 15, 2022 (JP) .................................. 2022-067593

(51) Int. Cl.
| | | |
|---|---|---|
| H01L 29/40 | (2006.01) | |
| H01L 21/02 | (2006.01) | |
| H01L 27/06 | (2006.01) | |
| H01L 29/06 | (2006.01) | |
| H01L 29/10 | (2006.01) | |

(Continued)

(52) U.S. Cl.
CPC ..... *H10D 64/118* (2025.01); *H01L 21/02236* (2013.01); *H01L 21/02255* (2013.01); *H10D 12/481* (2025.01); *H10D 62/107* (2025.01); *H10D 62/393* (2025.01); *H10D 64/111* (2025.01); *H10D 84/617* (2025.01)

(58) Field of Classification Search
CPC .. H10D 12/481; H10D 62/393; H10D 12/441; H10D 12/461; H10D 30/0297; H10D 30/107; H10D 30/605; H10D 62/60; H10D 62/106
See application file for complete search history.

(56) References Cited

U.S. PATENT DOCUMENTS

2003/0218220 A1    11/2003    Takahashi
2011/0291241 A1    12/2011    Yoshikawa
(Continued)

FOREIGN PATENT DOCUMENTS

JP    H1167753 A      3/1999
JP    H11297688 A    10/1999
(Continued)

*Primary Examiner* — John A Bodnar

(57) ABSTRACT

Provided is a semiconductor device including a semiconductor substrate having a first dopant of a first conductivity type and a second dopant of a second conductivity type, both the first dopant and the second dopant being distributed in an entire part of the semiconductor substrate, the semiconductor substrate including a drift region of the first conductivity type, a dielectric film provided on an upper surface of the semiconductor substrate, a high concentration region of the first conductivity type provided in contact with the dielectric film below the dielectric film and having a higher doping concentration than the drift region, and a fall off region that is provided in contact with the dielectric film below the dielectric film and in which a concentration of the dopant of the second conductivity type decreases toward the dielectric film.

29 Claims, 28 Drawing Sheets

(51) Int. Cl.
   *H01L 29/739* (2006.01)
   *H10D 12/00* (2025.01)
   *H10D 62/10* (2025.01)
   *H10D 62/17* (2025.01)
   *H10D 64/00* (2025.01)
   *H10D 84/60* (2025.01)

(56) References Cited

U.S. PATENT DOCUMENTS

| | | |
|---|---|---|
| 2013/0214394 A1 | 8/2013 | Senoo |
| 2015/0249149 A1 | 9/2015 | Lu |
| 2017/0018637 A1* | 1/2017 | Kitamura ............. H10D 12/038 |
| 2017/0062568 A1 | 3/2017 | Caspary |
| 2017/0229448 A1 | 8/2017 | Tanaka |
| 2018/0138274 A1* | 5/2018 | Ohse .................... H10D 64/513 |
| 2019/0326432 A1 | 10/2019 | Nakazawa |
| 2020/0395215 A1 | 12/2020 | Kubouchi |
| 2021/0265492 A1 | 8/2021 | Takishita |

FOREIGN PATENT DOCUMENTS

| | | |
|---|---|---|
| JP | 2003347547 A | 12/2003 |
| JP | 2008193043 A | 8/2008 |
| JP | 2009099863 A | 5/2009 |
| JP | 2010118440 A | 5/2010 |
| JP | 2011249580 A | 12/2011 |
| JP | 2013172087 A | 9/2013 |
| JP | 2013172088 A | 9/2013 |
| JP | 2017143136 A | 8/2017 |
| JP | 2019106554 A | 6/2019 |
| JP | 2019192678 A | 10/2019 |
| WO | 9629744 A1 | 9/1996 |
| WO | 2014112057 A1 | 7/2014 |
| WO | 2020230900 A1 | 11/2020 |

* cited by examiner

SEMICONDUCTOR DEVICE AND MANUFACTURING METHOD

The contents of the following Japanese patent applications are incorporated herein by reference:
NO. 2021-150094 filed in JP on Sep. 15, 2021
NO. 2022-067593 filed in JP on Apr. 15, 2022

BACKGROUND

1. Technical Field

The present invention relates to a semiconductor device and a manufacturing method.

2. Related Art

From the past, there is known a semiconductor device that includes an edge termination structure portion including guard rings (see, for example, Patent Document 1).
Patent Document 1: Japanese Patent Application Publication No. 2017-143136
In the edge termination structure portion or the like, a dielectric film is provided on an upper surface of a semiconductor substrate.

DESCRIPTION OF EXEMPLARY EMBODIMENTS

Figure 1:
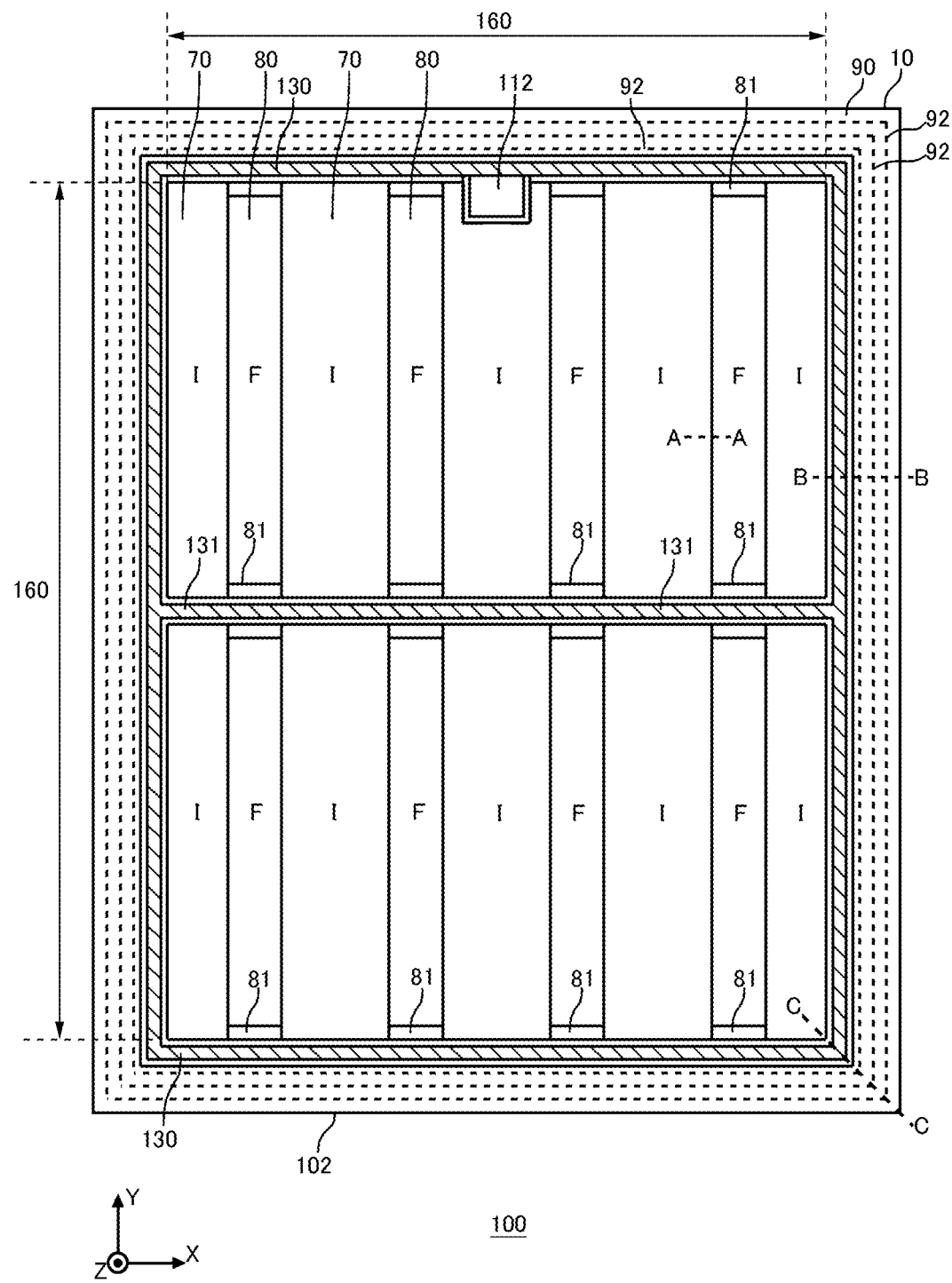
FIG. 1 is one example of a top view of a semiconductor device 100.

Hereinafter, the present invention will be described through embodiments of the invention, but the following embodiments do not limit the invention according to the claims. In addition, not all the combinations of features described in the embodiments are necessarily essential for a solution of the invention.

In the present specification, one side in a direction parallel to a depth direction of a semiconductor substrate is referred to as "upper", and the other side is referred to as "lower". One of two principal surfaces of a substrate, a layer, or other members is referred to as an upper surface, and the other surface is referred to as a lower surface. "Upper" and "lower" directions are not limited to a direction of gravity, or a direction in which a semiconductor device is mounted.

In the present specification, technical matters may be described using orthogonal coordinate axes of an X axis, a Y axis, and a Z axis. The orthogonal coordinate axes merely specify relative positions of components, and do not limit a specific direction. For example, the Z axis is not limited to indicate the height direction with respect to the ground. Note that a +Z axis direction and a −Z axis direction are directions opposite to each other. When the Z axis direction is described without describing the signs, it means that the direction is parallel to the +Z axis and the −Z axis.

In the present specification, orthogonal axes parallel to the upper surface and the lower surface of the semiconductor substrate are referred to as the X axis and the Y axis. Further, an axis perpendicular to the upper surface and the lower surface of the semiconductor substrate is referred to as the Z axis. In the present specification, the direction of the Z axis may be referred to as the depth direction. Further, in the present specification, a direction parallel to the upper surface and the lower surface of the semiconductor substrate may be referred to as a horizontal direction, including an X axis direction and a Y axis direction. In the present specification, an upper surface side of the semiconductor substrate refers to a region from the center to the upper surface of the semiconductor substrate in the depth direction. A lower surface side of the semiconductor substrate refers to a region from the center to the lower surface of the semiconductor substrate in the depth direction.

In the present specification, a case where a term such as "same" or "equal" is mentioned may include a case where an error due to a variation in manufacturing or the like is included. The error is, for example, within 10%.

In the present specification, a conductivity type of a doping region where doping has been carried out with an impurity is described as a P type or an N type. The N type and P type are examples of a first conductivity type and a second conductivity type. The N type may be the first conductivity type while the P type is the second conductivity type, or the P type may be the first conductivity type while the N type is the second conductivity type. In the present specification, the impurity may particularly mean either a donor of the N type or an acceptor of the P type, and may be described as a dopant. In the present specification, doping means introducing the donor or the acceptor into the semiconductor substrate and turning it into a semiconductor presenting a conductivity type of the N type, or a semiconductor presenting a conductivity type of the P type.

In the present specification, a doping concentration means a concentration of the donor or a concentration of the acceptor in a thermal equilibrium state. In the present specification, a net doping concentration means a net concentration obtained by adding the donor concentration set as a positive ion concentration to the acceptor concentration set as a negative ion concentration, taking polarities of charges into account. As an example, with the donor concentration being indicated by $N_D$ and the acceptor concentration being indicated by $N_A$, the net doping concentration as the net concentration at an arbitrary position becomes $|N_D-N_A|$.

The donor has a function of supplying electrons to a semiconductor. The acceptor has a function of receiving electrons from the semiconductor. The donor and acceptor are not limited to the impurities themselves. For example, a VOH defect which is a combination of a vacancy (V), oxygen (O), and hydrogen (H) existing in the semiconductor functions as the donor that supplies electrons.

In the present specification, a description of a P+ type or an N+ type means a higher doping concentration than that of the P type or the N type, and a description of a P− type or an N− type means a lower doping concentration than that of the P type or the N type. Further, in the present specification, a description of a P++ type or an N++ type means a higher doping concentration than that of the P+ type or the N+ type.

A chemical concentration in the present specification indicates an atomic density of an impurity measured regardless of an electrical activation state. The chemical concentration (atomic density) can be measured by, for example, secondary ion mass spectrometry (SIMS). The net doping concentration described above can be measured by voltage-capacitance profiling (CV method). In addition, a carrier density measured by a spreading resistance method (SRP method) may be used as the net doping concentration. It may be assumed that the carrier density measured by the CV method or the SRP method is a value in a thermal equilibrium state. In addition, because, in an N type region, the donor concentration is sufficiently larger than the acceptor concentration, the carrier density in the region may be used as the donor concentration. Similarly, the carrier density in a P type region may be used as the acceptor concentration in the region.

In addition, when a concentration distribution of the donor, acceptor, or net doping has a peak in a region, a value of the peak may be set as the concentration of the donor, acceptor, or net doping in the region. When the concentration of the donor, acceptor, or net doping is substantially uniform in a region, or the like, an average value of the concentration of the donor, acceptor, or net doping in the region may be set as the concentration of the donor, acceptor, or net doping.

The carrier density measured by the SRP method may be lower than the concentration of a donor or an acceptor. In a range where a current flows when a spreading resistance is measured, carrier mobility of the semiconductor substrate may be lower than a value in a crystalline state. The reduction in carrier mobility occurs when carriers are scattered due to disorder (disorder) of a crystal structure due to a lattice defect or the like.

The concentration of a donor or an acceptor calculated from a carrier density measured by the CV method or the SRP method may be lower than a chemical concentration of an element indicating the donor or the acceptor. As an example, in a silicon semiconductor, a donor concentration of phosphorus or arsenic serving as a donor, or an acceptor concentration of boron serving as an acceptor is approximately 99% of chemical concentrations of these. On the other hand, in the silicon semiconductor, a donor concentration of hydrogen serving as a donor is approximately 0.1% to 10% of a chemical concentration of hydrogen.

FIG. 1 is one example of a top view of the semiconductor device 100. FIG. 1 shows a position at which each member is projected on an upper surface of a semiconductor substrate 10. FIG. 1 shows merely some members of the semiconductor device 100, and omits illustrations of some members.

The semiconductor device 100 includes the semiconductor substrate 10. The semiconductor substrate 10 is a substrate that is formed of a semiconductor material. As an example, the semiconductor substrate 10 is a silicon substrate. N type bulk donors are distributed throughout the semiconductor substrate 10 of this example. The bulk donor is a dopant donor substantially uniformly contained in an ingot during manufacturing of the ingot from which the semiconductor substrate 10 is made. The bulk donor of this example is an element other than hydrogen. The bulk donor dopant is, for example, an element of group V or group VI, and is, for example, but not limited to, phosphorus, antimony, arsenic, selenium, or sulfur. The bulk donor of this example is phosphorus. The bulk donor is also contained in the P type region. The semiconductor substrate 10 may be a wafer cut out from a semiconductor ingot, or may be a chip obtained by singulating the wafer. The semiconductor ingot may be manufactured by any one of a Czochralski method (CZ method), a magnetic field applied Czochralski method (MCZ method), and a float zone method (FZ method).

An oxygen chemical concentration contained in the substrate manufactured by the MCZ method is, for example, $1 \times 10^{17}$ to $7 \times 10^{17}$ atoms/cm$^3$. The oxygen chemical concentration contained in the substrate manufactured by the FZ method is, for example, $1 \times 10^{15}$ to $5 \times 10^{16}$ atoms/cm$^3$. As the bulk donor concentration, the chemical concentration of the bulk donor distributed throughout the semiconductor substrate 10 may be used, or a value between 90% to 100% of the chemical concentration may be used. In the semiconductor substrate doped with dopants of groups V and VI such as phosphorus, the bulk donor concentration may be $1 \times 10^{11}$/cm$^3$ or more and $3 \times 10^{13}$/cm$^3$ or less. The bulk donor concentration of the semiconductor substrate doped with the dopants of groups V and VI is preferably $1 \times 10^{12}$/cm$^3$ or more and $1 \times 10^{13}$/cm$^3$ or less. In addition, as the semiconductor substrate 10, a non-doped substrate substantially not containing a bulk dopant such as phosphorus may be used. In this case, the bulk donor concentration of the non-doped substrate is, for example, $1 \times 10^{10}$/cm$^3$ or more and $5 \times 10^{12}$/cm$^3$ or less. The bulk donor concentration of the non-doped substrate is preferably $1 \times 10^{11}$/cm$^3$ or more. The bulk donor concentration of the non-doped substrate is preferably $5 \times 10^{12}$/cm$^3$ or less.

Furthermore, a P type bulk acceptor may be distributed in the entire semiconductor substrate 10. The bulk acceptor may be a dopant acceptor substantially uniformly contained in an ingot during the manufacturing of the ingot from which the semiconductor substrate 10 is made, or may be an acceptor implanted into the entire wafer- or chip-type semiconductor substrate 10. The bulk acceptors may be boron. The bulk acceptor concentration may be lower than the bulk donor concentration. That is, the bulk of the ingot or semiconductor substrate 10 is of an N type. As an example, the bulk acceptor concentration is between $5 \times 10^{11}$ (/cm$^3$) and $8 \times 10^{14}$ (/cm$^3$), and the bulk donor concentration is between $5 \times 10^{12}$ (/cm$^3$) and $1 \times 10^{15}$ (/cm$^3$). The bulk acceptor concentration may be 1% or more, 10% or more, or 50% or more of the bulk donor concentration. The bulk acceptor concentration may be 99% or less, 95% or less, or 90% or less of the bulk donor concentration. As the bulk acceptor concentration and the bulk donor concentration, the chemical concentration of impurities such as boron and phosphorus distributed in the entire semiconductor substrate 10 may be used. As the bulk acceptor concentration and the bulk donor concentration, a value of the chemical concentration of impurities such as boron and phosphorus distributed in the entire semiconductor substrate 10, that is obtained at a center of the semiconductor substrate 10 in a depth direction, may be used.

The semiconductor substrate 10 has an upper surface and a lower surface.

The upper surface and the lower surface are two principal surfaces of the semiconductor substrate 10. The semiconductor substrate 10 has an end side 102 in a top view. When merely referred to as the top view in the present specification, it means that the semiconductor substrate 10 is viewed from an upper surface side. The semiconductor substrate 10 of this example includes two pairs of end sides 102 opposing each other in a top view. In FIG. 1, the X axis and the Y axis are parallel to any of the end sides 102. In addition, the Z axis is perpendicular to the upper surface of the semiconductor substrate 10.

The semiconductor substrate 10 is provided with an active portion 160. The active portion 160 is a region where a main current flows in the depth direction between the upper surface and the lower surface of the semiconductor substrate 10 when the semiconductor device 100 operates. An emitter electrode is provided above the active portion 160, but an illustration thereof is omitted in FIG. 1.

In the active portion 160, there is provided at least one of a transistor portion 70 which includes a transistor device such as an IGBT, and a diode portion 80 which includes a diode device such as a freewheeling diode (FWD). In the example of FIG. 1, the transistor portion 70 and the diode portion 80 are alternately arranged along a predetermined array direction (the X axis direction in this example) on the upper surface of the semiconductor substrate 10. In another example, the active portion 160 may be provided with only one of the transistor portion 70 and the diode portion 80.

In FIG. 1, a region where the transistor portion 70 is arranged is denoted by a symbol "I", and a region where the diode portion 80 is arranged is denoted by a symbol "F". In the present specification, a direction perpendicular to the array direction in the top view may be referred to as an extension direction (the Y axis direction in FIG. 1). Each of the transistor portions 70 and the diode portions 80 may have a longitudinal length in the extension direction. That is, the length of the transistor portion 70 in the Y axis direction is greater than the width thereof in the X axis direction. Similarly, the length of the diode portion 80 in the Y axis direction is greater than the width thereof in the X axis direction. The extension direction of the transistor portion 70 and the diode portion 80 may be the same as the longitudinal direction of each trench portion to be described later.

The diode portion 80 includes an N+ type cathode region in a region in contact with the lower surface of the semiconductor substrate 10. In the present specification, a region where the cathode region is provided is referred to as the diode portion 80. In other words, the diode portion 80 is a region overlapping with the cathode region in a top view. On the lower surface of the semiconductor substrate 10, a collector region of P+ type may be provided in a region other than the cathode region. In the present specification, an extension region 81 obtained by extending the diode portion 80 in the Y axis direction to a gate runner to be described later may also be included in the diode portion 80. The collector region is provided on a lower surface of the extension region 81.

The transistor portion 70 has the collector region of the P+ type in a region in contact with the lower surface of the semiconductor substrate 10. Further, in the transistor portion 70, a gate structure including an N+ type emitter region, a P− type base region, a gate conductive portion, and a gate dielectric film is cyclically arranged on the upper surface side of the semiconductor substrate 10.

The semiconductor device 100 may have one or more pads above the semiconductor substrate 10. The semiconductor device 100 of this example has a gate pad 112. The semiconductor device 100 may include an anode pad and a cathode pad to be connected to a temperature detection diode, or may include a current detection pad. Each pad is arranged in the vicinity of the end side 102. The vicinity of the end side 102 refers to a region between the end side 102 and the emitter electrode, in a top view. When mounting the semiconductor device 100, each pad may be connected to an external circuit via a wiring such as a wire.

A gate potential is applied to the gate pad 112. The gate pad 112 is electrically connected to the conductive portion of the gate trench portion of the active portion 160. The semiconductor device 100 includes a gate runner that connects the gate pad 112 and the gate trench portion. In FIG. 1, the gate runner is hatched with diagonal lines.

The gate runner of this example has an outer circumferential gate runner 130 and an active-side gate runner 131. The outer circumferential gate runner 130 is arranged between the active portion 160 and the end side 102 of the semiconductor substrate 10 in the top view. The outer circumferential gate runner 130 of this example encloses the active portion 160 in the top view. A region enclosed by the outer circumferential gate runner 130 in the top view may be the active portion 160. In addition, the outer circumferential gate runner 130 is connected to the gate pad 112. The outer circumferential gate runner 130 is arranged above the semiconductor substrate 10. The gate runner may be a metal wiring including aluminum or the like, a wiring formed of polysilicon, or a laminated wiring in which those wirings are laminated.

The active-side gate runner 131 is provided in the active portion 160. With the provision of the active-side gate runner 131 in the active portion 160, it is possible to reduce a variation in wiring length from the gate pad 112 in each region of the semiconductor substrate 10.

The active-side gate runner 131 is connected to the gate trench portion of the active portion 160. The active-side gate runner 131 is arranged above the semiconductor substrate 10. The active-side gate runner 131 may be a wiring formed of a semiconductor such as polysilicon doped with an impurity.

The active-side gate runner 131 may be connected to the outer circumferential gate runner 130. The active-side gate runner 131 of this example is provided to extend in the X axis direction so as to cross the active portion 160 from one outer circumferential gate runner 130 to the other outer circumferential gate runner 130 substantially at the center of the Y axis direction. When the active portion 160 is divided by the active-side gate runner 131, the transistor portion 70 and the diode portion 80 may be alternately arranged in the X axis direction in each divided region.

Further, the semiconductor device 100 may include a temperature sensing portion (not shown) that is a PN junction diode formed of polysilicon or the like, and a current detection portion (not shown) that simulates an operation of the transistor portion provided in the active portion 160.

The semiconductor device 100 of this example includes an edge termination structure portion 90 between the active portion 160 and the end side 102. The edge termination structure portion 90 is provided outside the active portion 160 in the semiconductor substrate 10. Outside in the semiconductor substrate 10 refers to a side closer to the end side 102. The edge termination structure portion 90 of this example is arranged between the outer circumferential gate runner 130 and the end side 102. The edge termination structure portion 90 reduces an electric field strength on the upper surface side of the semiconductor substrate 10. The edge termination structure portion 90 includes a plurality of guard rings 92. The guard ring 92 is a P type region in contact with the upper surface of the semiconductor substrate 10. The guard ring 92 may enclose the active portion 160 in a top view. The plurality of guard rings 92 are arranged at predetermined intervals between the outer circumferential gate runner 130 and the end side 102. The guard ring 92 arranged on the outer side may enclose the guard ring 92 arranged on the inner side by one. The outer side refers to a side closer to the end side 102, and the inner side refers to a side closer to the center of the semiconductor substrate 10 in the top view. By providing the plurality of guard rings 92, the depletion layer on the upper surface side of the active portion 160 can be extended outward, and the breakdown voltage of the semiconductor device 100 can be improved. The edge termination structure portion 90 may further include at least one of a field plate and a RESURF annularly provided to enclose the active portion 160.

Figure 2:
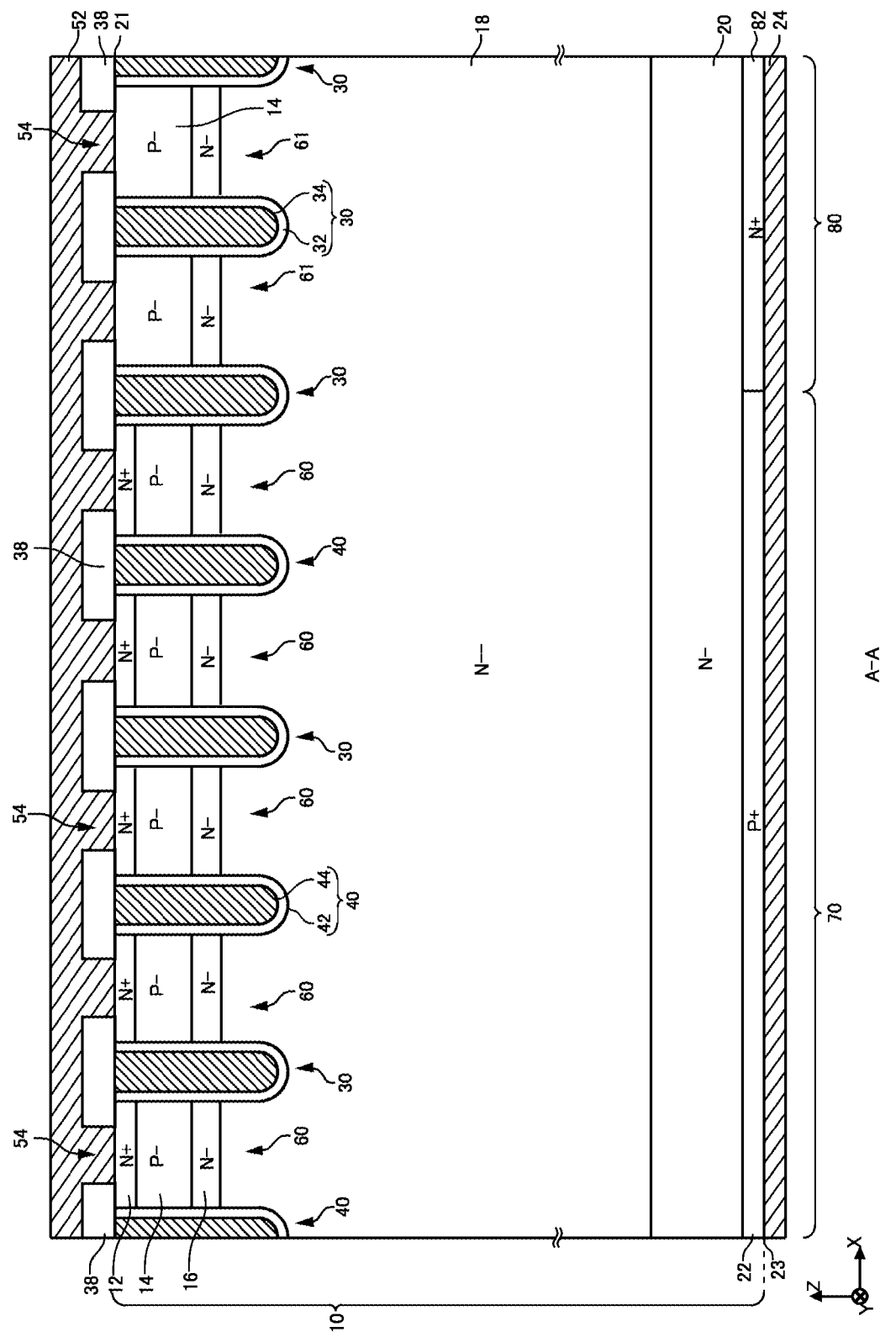
FIG. 2 shows an example of a cross section taken along A-A in FIG. 1.

FIG. 2 shows an example of a cross section taken along A-A in FIG. 1. The cross section A-A is an XZ plane that passes through the transistor portion 70 and the diode portion 80. The semiconductor device 100 of this example includes the semiconductor substrate 10, the interlayer dielectric film 38, the emitter electrode 52, and the collector electrode 24 in the cross section. The interlayer dielectric film 38 is provided on an upper surface 21 of the semiconductor substrate 10. The interlayer dielectric film 38 is a film including at least one layer of a dielectric film formed of silicate glass or the like to which impurities such as boron, phosphorus, or the like are added, a thermally oxidized film, a nitride film, or other dielectric films. Contact holes 54 that connect the emitter electrode 52 and the semiconductor substrate 10 are provided in the interlayer dielectric film 38.

The emitter electrode 52 is provided above the interlayer dielectric film 38. The emitter electrode 52 is in contact with the upper surface 21 of the semiconductor substrate 10 through the contact hole 54 of the interlayer dielectric film 38. The emitter electrode 52 may be in contact with an emitter region 12, a contact region, and a base region 14 to be described later. The collector electrode 24 is provided on a lower surface 23 of the semiconductor substrate 10. The emitter electrode 52 and the collector electrode 24 are made of a metal material such as aluminum. In the present specification, the direction in which the emitter electrode 52 is connected to the collector electrode 24 (the Z axis direction) is referred to as a depth direction.

The semiconductor substrate 10 includes an N− type drift region 18. A doping concentration of the drift region 18 may be identical to the bulk donor concentration or may be identical to the bulk net doping concentration which is a difference between the bulk donor concentration and the bulk acceptor concentration. In another example, the doping concentration of the drift region 18 may be higher than the bulk donor concentration or the bulk net doping concentration. The drift region 18 is provided in each of the transistor portion 70 and the diode portion 80.

One or more gate trench portions 40 and dummy trench portions 30 are provided on the upper surface side of the semiconductor substrate 10. The gate trench portions 40 are applied with a gate voltage so as to function as gate electrodes, and the dummy trench portions 30 are not applied with a gate voltage so as not to function as the gate electrode. In the present specification, the gate trench portions 40 and the dummy trench portions 30 may be referred to as trench portions. The trench portions are provided from the upper surface 21 of the semiconductor substrate 10 to the drift region 18 in the depth direction. Further, the trench portions extend in the extension direction (Y axis direction) on the upper surface 21 of the semiconductor substrate 10.

Each of the transistor portion 70 and the diode portion 80 includes a plurality of trench portions arranged in the array direction. In the transistor portion 70 of this example, one or more gate trench portions 40 and one or more dummy trench portions 30 are alternately provided along the array direction. In the diode portion 80 of this example, the plurality of dummy trench portions 30 are provided along the array direction. The diode portion 80 of this example is not provided with the gate trench portion 40.

A mesa portion is provided between the respective trench portions in the array direction. The mesa portion refers to a region sandwiched between the trench portions inside the semiconductor substrate 10. As an example, an upper end of the mesa portion is the upper surface of the semiconductor substrate 10. The depth position of the lower end of the mesa portion is the same as the depth position of the lower end of the trench portion. The mesa portion of this example is provided extending in the extension direction (the Y axis direction) along the trench portion, on the upper surface of the semiconductor substrate 10. In this example, a mesa portion 60 is provided in the transistor portion 70, and a mesa portion 61 is provided in the diode portion 80. In the case of simply referring to as a mesa portion in the present specification, the mesa portion refers to each of the mesa portion 60 and the mesa portion 61.

In the mesa portion 60 of the transistor portion 70, an N+ type emitter region 12 and a P− type base region 14 are provided in order from the upper surface 21 side of the semiconductor substrate 10. The drift region 18 is provided below the base region 14. An N− type accumulation region 16 may also be provided in the mesa portion 60. The accumulation region 16 is arranged between the base region 14 and the drift region 18.

The emitter region 12 is exposed on the upper surface 21 of the semiconductor substrate 10 and is provided in contact with the gate trench portion 40. The emitter region 12 may be in contact with the trench portions on both sides of the mesa portion 60. The emitter region 12 has a higher doping concentration than the drift region 18.

The base region 14 is provided below the emitter region 12. The base region 14 of this example is provided in contact with the emitter region 12. The base region 14 may be in contact with the trench portions on both sides of the mesa portion 60.

The accumulation region 16 is provided below the base region 14. The accumulation region 16 is an N– type region that has a higher doping concentration than the drift region 18. By providing the accumulation region 16 having the high concentration between the drift region 18 and the base region 14, it is possible to improve a carrier injection enhancement effect (IE effect) and reduce an on-voltage. The accumulation region 16 may be provided to cover a whole lower surface of the base region 14 in each mesa portion 60.

The mesa portion 61 of the diode portion 80 is provided with the P– type base region 14 in contact with the upper surface 21 of the semiconductor substrate 10. The drift region 18 is provided below the base region 14. In the mesa portion 61, the accumulation region 16 may be provided below the base region 14.

A P+ type contact region exposed on the upper surface 21 of the semiconductor substrate 10 may be provided in at least one of the mesa portion 60 and the mesa portion 61. For example, in the mesa portion 60, the contact region and the emitter region 12 may be arranged alternately along the Y axis direction.

In each of the transistor portions 70 and the diode portions 80, an N– type buffer region 20 may be provided closer to the lower surface 23 side than the drift region 18. A doping concentration of the buffer region 20 is higher than the doping concentration of the drift region 18. The buffer region 20 includes one or a plurality of donor concentration peaks having a higher donor concentration than the drift region 18. The buffer region 20 may function as a field stop layer which prevents a depletion layer expanding from the lower end of the base region 14 from reaching the P+ type collector region 22 and the N+ type cathode region 82.

In the transistor portion 70, the P+ type collector region 22 is provided below the buffer region 20. An acceptor concentration of the collector region 22 is higher than an acceptor concentration of the base region 14. The collector region 22 may include an acceptor which is the same as or different from an acceptor of the base region 14. The acceptor of the collector region 22 is, for example, boron.

In the diode portion 80, the N+ type cathode region 82 is provided below the buffer region 20. A donor concentration of the cathode region 82 is higher than the donor concentration of the drift region 18. The donor of the cathode region 82 is, for example, hydrogen or phosphorus. Note that elements to be donors and acceptors in each region are not limited to the examples described above. The collector region 22 and the cathode region 82 are exposed on the lower surface 23 of the semiconductor substrate 10 and are connected to the collector electrode 24. The collector electrode 24 may be in contact with the entire lower surface 23 of the semiconductor substrate 10. The emitter electrode 52 and the collector electrode 24 are formed of a metal material such as aluminum.

Each trench portion penetrates the base region 14 from the upper surface 21 of the semiconductor substrate 10 and reaches the drift region 18. In the region where at least any one of the emitter region 12, the contact region, and the accumulation region 16 is provided, each trench portion also penetrates these doping regions and reaches the drift region 18. The trench portion penetrating the doping region is not limited to those manufactured in the order of forming the doping region and then forming the trench portion. A case where a doping region is formed between the trench portions after the trench portion is formed is also included in the case where the trench portion penetrates the doping region.

As described above, the transistor portion 70 is provided with the gate trench portion 40 and the dummy trench portion 30. In the diode portion 80, the dummy trench portion 30 is provided, and the gate trench portion 40 is not provided. In this example, the boundary between the diode portion 80 and the transistor portion 70 in the X axis direction is the boundary between the cathode region 82 and the collector region 22.

The gate trench portion 40 includes a groove-like gate trench provided on the upper surface 21 of the semiconductor substrate 10, a gate dielectric film 42, and a gate conductive portion 44. The gate trench portion 40 is one example of a gate structure. The gate dielectric film 42 is provided to cover the inner wall of the gate trench. The gate dielectric film 42 may be formed by oxidizing or nitriding a semiconductor on the inner wall of the gate trench. The gate conductive portion 44 is provided on the inner side of the gate dielectric film 42 inside the gate trench. That is, the gate dielectric film 42 insulates the gate conductive portion 44 from the semiconductor substrate 10. The gate conductive portion 44 is formed of a conductive material such as polysilicon.

The gate conductive portion 44 may be provided longer than the base region 14 in the depth direction. The gate trench portion 40 in the cross section is covered by the interlayer dielectric film 38 on the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portions 30 may have the same structure as the gate trench portions 40 in the cross section. The dummy trench portion 30 includes a dummy trench provided in the upper surface 21 of the semiconductor substrate 10, a dummy dielectric film 32, and a dummy conductive portion 34. The dummy conductive portion 34 may be connected to an electrode different from the gate pad. For example, the dummy conductive portion 34 may be connected to a dummy pad (not shown) connected to an external circuit different from the gate pad, and control different from that of the gate conductive portion 44 may be performed. In addition, the dummy conductive portion 34 may be electrically connected to the emitter electrode 52. The dummy dielectric film 32 is provided to cover the inner wall of the dummy trench. The dummy conductive portion 34 is provided in the dummy trench, and is provided on the inner side of the dummy dielectric film 32. The dummy dielectric film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon. The dummy conductive portion 34 may have the same length as the gate conductive portion 44 in the depth direction.

The gate trench portion 40 and the dummy trench portion 30 in the cross section are covered by the interlayer dielectric film 38 on the upper surface 21 of the semiconductor substrate 10. As described above, the gate trench portion 40 may be connected to the gate runner at any of the positions, and the dummy trench portion 30 may be connected to the emitter electrode 52 at any of the positions.

Figure 3:
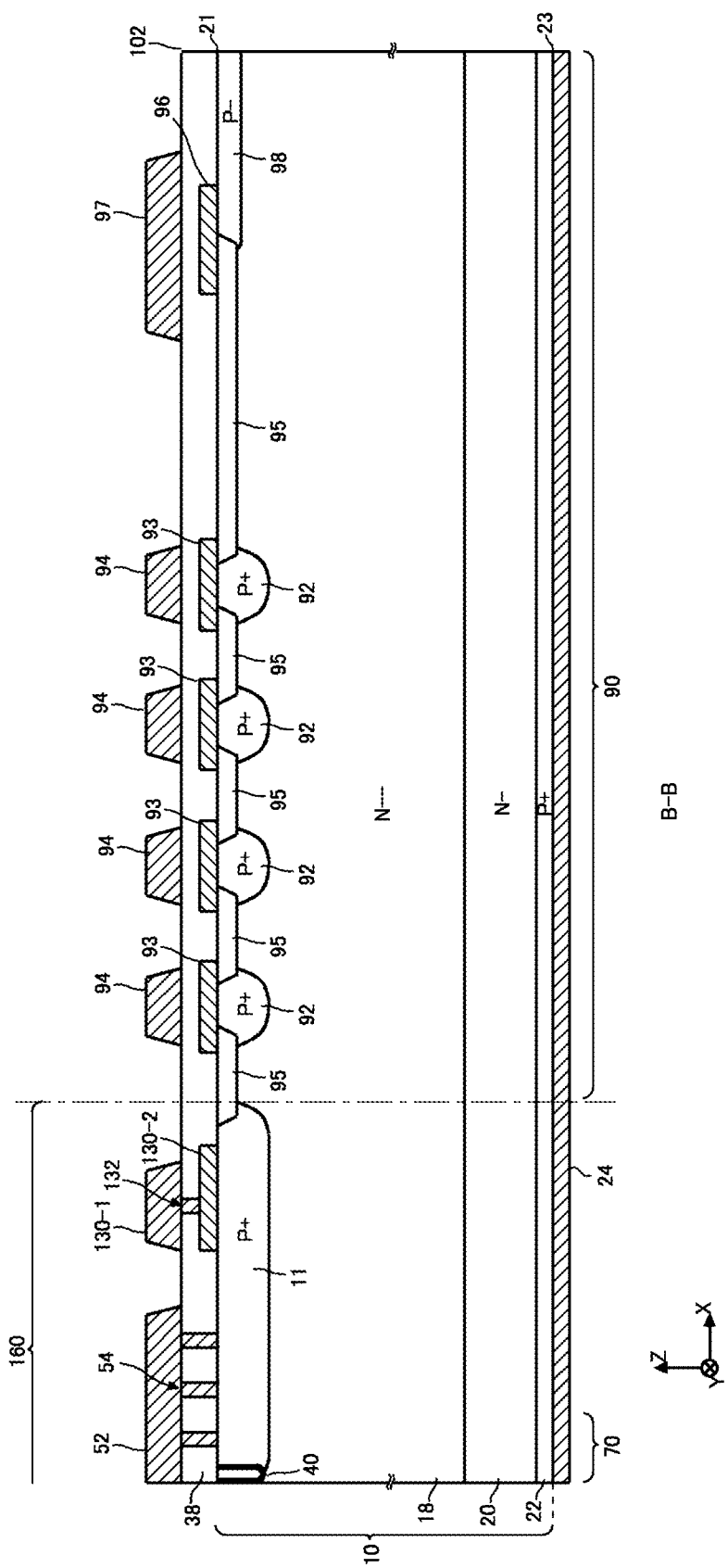
FIG. 3 shows an example of a cross section taken along B-B in FIG. 1.

FIG. 3 shows an example of a cross section taken along B-B in FIG. 1. The cross section B-B is an XZ plane that passes the outer circumferential gate runner 130 and the edge termination structure portion 90. In FIG. 3, a part of the transistor portion 70 in the vicinity of the outer circumferential gate runner 130 is also illustrated.

The outer circumferential gate runner 130 is arranged above the upper surface 21 of the semiconductor substrate 10. In this example, an outer circumferential gate runner 130-1 and an outer circumferential gate runner 130-2 are arranged while being laminated in the Z axis direction. The outer circumferential gate runner 130-1 is formed of a metal material such as aluminum, and the outer circumferential gate runner 130-2 is formed of polysilicon to which impurities are added.

Note that the outer circumferential gate runner 130-2 and the semiconductor substrate 10 are insulated by a dielectric film such as a thermally oxidized film, though an illustration is omitted in FIG. 3. The outer circumferential gate runner 130-2 is connected to the gate conductive portion 44 at any of the positions.

The outer circumferential gate runner 130-1 is arranged above the outer circumferential gate runner 130-2. The interlayer dielectric film 38 is arranged between the outer circumferential gate runner 130-1 and the outer circumferential gate runner 130-2. A contact hole 132 for connecting the outer circumferential gate runner 130-1 and the outer circumferential gate runner 130-2 is provided in the interlayer dielectric film 38. The contact hole 132 may be provided so as to enclose the active portion 160 along the outer circumferential gate runner 130. The outer circumferential gate runner 130-1 connects with the outer circumferential gate runner 130-2 via the contact hole 132.

A well region 11 is provided in the semiconductor substrate 10 below the outer circumferential gate runner 130. The well region 11 is provided to be deeper than the base region 14 from the upper surface 21 of the semiconductor substrate 10. The well region 11 is preferably provided to be deeper than the trench portion. The well region 11 is a P+ type region having a higher concentration than the base region 14. The interlayer dielectric film 38 may be formed between the emitter electrode 52 and the well region 11. The well region 11 may be connected to the emitter electrode 52 via one or more contact holes 54 formed in the interlayer dielectric film 38. That is, the well region 11 may be electrically connected to the emitter electrode 52.

The well region 11 is provided while overlapping with the outer circumferential gate runner 130. The well region 11 may extend by a predetermined width also within a range where it does not overlap with the outer circumferential gate runner 130. In addition, the well region 11 may be provided so as to enclose the active portion 160 along the outer circumferential gate runner 130. The well region 11 may also be arranged below the active-side gate runner 131. By providing the well region 11, it becomes possible to easily extend the depletion layer that expands from the active portion 160 to the edge termination structure portion 90 and suppress breakage in the active portion 160.

The edge termination structure portion 90 includes the plurality of guard rings 92 and a plurality of embedded dielectric films 95. The edge termination structure portion 90 of this example further includes a plurality of field plates 93, a plurality of field electrodes 94, an outer electrode 97, an outer plate 96, and a channel stopper 98. The edge termination structure portion 90 may be a region provided closer to an outer circumference side than an outer circumference edge of the well region 11.

The guard rings 92 are each a P+ type region that is provided in contact with the upper surface 21 of the semiconductor substrate 10. As shown in FIG. 1, the respective guard rings 92 enclose the active portion 160. The active portion 160 may be a region provided closer to an inner circumference side than the outer circumference edge of the well region 11. A lower end of the guard ring 92 may be arranged closer to the lower surface 23 side than the lower end of the base region 14. The lower end of the guard ring 92 may be arranged closer to the lower surface 23 side than the lower end of the trench portion. The lower end of the guard ring 92 may be arranged closer to the lower surface 23 side than the lower end of the well region 11, may be arranged closer to the upper surface 21 side than the lower end of the well region 11, or may be arranged at the same depth position as the lower end of the well region 11. The lower end of the guard ring 92 in this example is arranged at the same depth position as the lower end of the well region 11.

Each of the embedded dielectric films 95 is arranged between two of the guard rings 92. The embedded dielectric films 95 may be provided so as to enclose the active portion 160 along the guard rings 92. The embedded dielectric film 95 may also be provided between the guard ring 92 at an outermost circumference and the channel stopper 98. The embedded dielectric film 95 may also be provided between the guard ring 92 at an innermost circumference and the well region 11.

The embedded dielectric film 95 is at least partially embedded inside the semiconductor substrate 10. That is, at least a part of the embedded dielectric film 95 is arranged below the upper surface 21 of the semiconductor substrate 10. The upper surface 21 of the semiconductor substrate 10 may refer to a surface on an uppermost side out of the surfaces formed of a semiconductor material such as silicon. A thickness of the embedded dielectric film 95 at a portion below the upper surface 21 of the semiconductor substrate 10 may be larger than a thickness thereof at a portion above the upper surface 21. The entire embedded dielectric film 95 may be provided at the same position as or on the lower side of the upper surface 21 of the semiconductor substrate 10. An upper surface of the embedded dielectric film 95 in this example is at the same position as the upper surface 21 of the semiconductor substrate 10, and the entire embedded dielectric film 95 is provided on the lower side of the upper surface 21 from the same position as the upper surface 21 of the semiconductor substrate 10.

The embedded dielectric film 95 may include a dielectric film obtained by oxidizing or nitriding the semiconductor substrate 10, may include a dielectric film deposited by CVD or the like, or may include other dielectric films. The embedded dielectric film 95 may be a single-layer dielectric film or may be a dielectric film in which a plurality of films formed by different methods are laminated. The embedded dielectric film 95 of this example is a LOCOS film obtained by forming a recess on the upper surface 21 of the semiconductor substrate 10 and thermally oxidizing the semiconductor material exposed in the recess.

By providing the embedded dielectric films 95, the semiconductor substrate 10 is prevented from being exposed among the guard rings 92. That is, the semiconductor substrate 10 among the guard rings 92 is prevented from coming into contact with a conductive member. Further, by arranging at least a part of the embedded dielectric film 95 inside the semiconductor substrate 10, asperities on the upper surface 21 of the semiconductor substrate 10 can be reduced. Accordingly, it becomes easy to form members to be arranged above the upper surface 21 of the semiconductor substrate 10. For example, since unevenness of the field plates 93 can be reduced, the field plates 93 can be formed with ease.

The field plates 93 in this example are formed of polysilicon to which impurities are added. The field plate 93 is arranged above the guard ring 92. The field plate 93 is arranged so as to cover at least a part of the guard ring 92. The field plate 93 may be arranged so as to cover the entire guard ring 92. The field plate 93 may extend to positions that do not overlap with the guard ring 92. A dielectric film such as a thermally oxidized film may be provided between the field plate 93 and the semiconductor substrate 10. In another example, the field plate 93 and the guard ring 92 may come into contact with each other as shown in FIG. 3.

Figure 9:
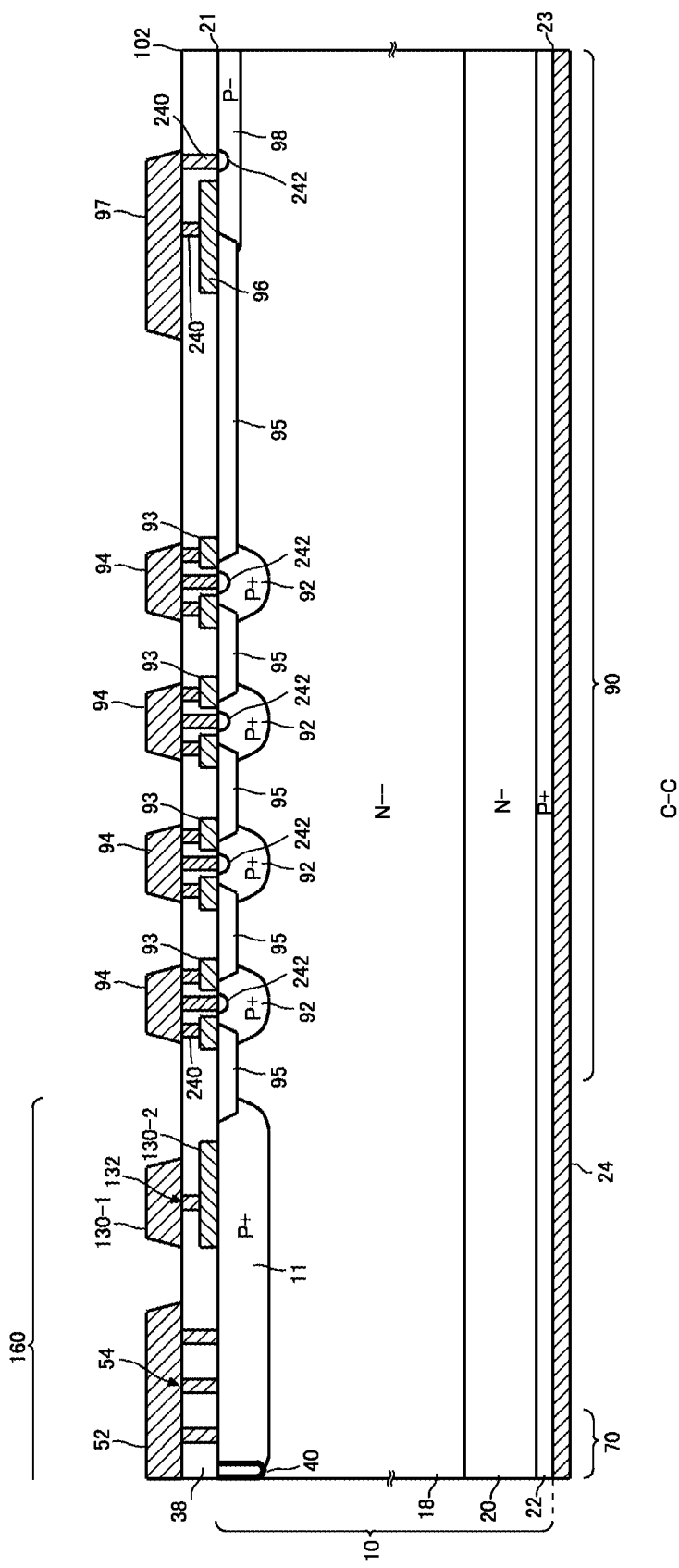
FIG. 9 shows an example of a cross section taken along C-C in FIG. 1.

The field electrodes 94 in this example are formed of a metal material such as aluminum. The field electrode 94 is arranged above the field plate 93. The interlayer dielectric film 38 is arranged between the field electrode 94 and the field plate 93. The field electrode 94 and the field plate 93 are connected to each other via a contact hole provided in the interlayer dielectric film 38. Although the contact holes are not illustrated in the cross section shown in FIG. 3, the contact holes are provided in the interlayer dielectric film 38 in other cross sections. For example, as shown in FIG. 9 to be described later that shows a cross section taken along C-C of FIG. 1, the contact holes are provided in the interlayer dielectric film 38 in the vicinity of a corner of the semiconductor substrate 10. In addition, the interlayer dielectric film 38 is provided with the contact hole that connects the field electrode 94 and the guard ring 92. The contact hole may also be provided in the vicinity of the corner of the semiconductor substrate 10. Each of the field electrodes 94 is electrically floated. For example, when a voltage $V_{CE}$ is applied to the collector electrode 24 in a state where the gate of the semiconductor device 100 is off, a predetermined voltage lower than the voltage $V_{CE}$ is applied to each of the field electrodes 94.

The channel stopper 98 is provided in contact with the end sides 102 and upper surface 21 of the semiconductor substrate 10. The channel stopper 98 is of a P type having a concentration that is the same as or higher than that of the base region 14, or an N type having a higher concentration than the drift region 18. The outer plate 96 is arranged above the channel stopper 98 and is electrically connected to the channel stopper 98. The outer plate 96 is formed of polysilicon to which impurities are added. The outer plate 96 and the channel stopper 98 may be provided on a dielectric film not shown, may be connected via a contact hole provided in the dielectric film, or may be connected directly. The channel stopper 98 may be connected to the outer electrode 97 via the contact hole.

The outer electrode 97 is arranged above the outer plate 96. The outer electrode 97 is formed of a metal material such as aluminum. The interlayer dielectric film 38 is provided between the outer electrode 97 and the outer plate 96. The outer electrode 97 and the outer plate 96 are connected via the contact hole provided in the interlayer dielectric film 38. The contact hole may be provided in the vicinity of the corner of the semiconductor substrate 10. A predetermined voltage is applied to the outer electrode 97. A potential of the channel stopper 98 is a potential of the collector electrode 24. By setting the potential of the channel stopper 98 to be the potential of the collector electrode 24, spreading of the depletion layer expanding from the active portion 160 is suppressed by the outer electrode 97 to thus prevent it from reaching side surfaces of the semiconductor substrate 10.

Accordingly, a breakdown voltage of the semiconductor device 100 can be improved. Note that the outer plate 96 does not need to be provided. In this case, the channel stopper 98 is connected to the outer electrode 97 via the contact hole provided in the interlayer dielectric film 38.

Figure 4:
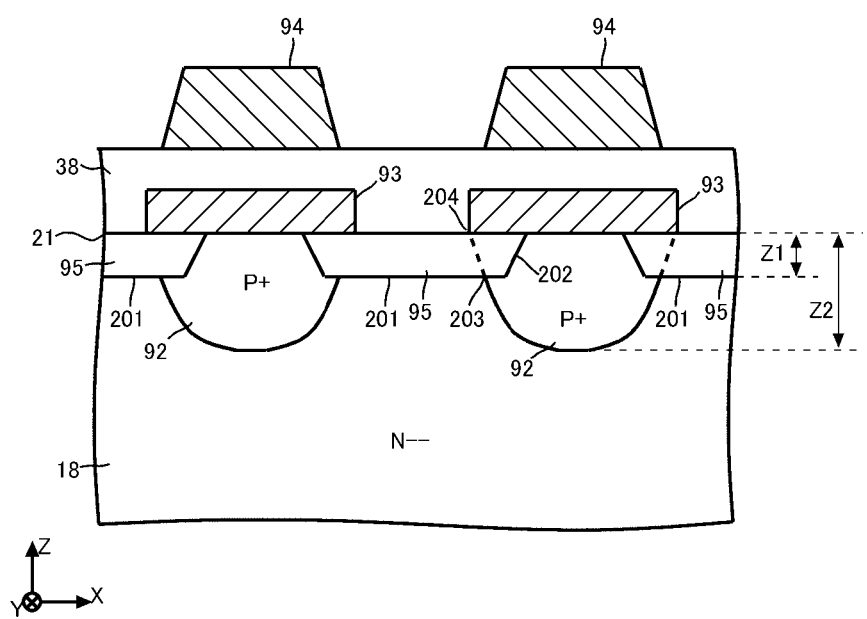
FIG. 4 shows an enlarged diagram showing a vicinity of guard rings 92 and embedded dielectric films 95.

FIG. 4 shows an enlarged diagram showing the vicinity of the guard rings 92 and the embedded dielectric films 95. The guard ring 92 is provided to reach below the embedded dielectric film 95. That is, an end portion 203 of the guard ring 92 (the end portion in the X axis direction in FIG. 4) overlaps with the embedded dielectric film 95 at a position below the embedded dielectric film 95. A distance between the upper surface 21 of the semiconductor substrate 10 and a lower end of the embedded dielectric film 95 in the Z axis direction is indicated by Z1, and a distance between the upper surface 21 of the semiconductor substrate 10 and the lower end of the guard ring 92 in the Z axis direction is indicated by Z2. The distance Z2 is larger than the distance Z1. The distance Z2 may be 1.5 times or more, 2 times or more, or 3 times or more of the distance Z1. On the other hand, a difference between the distance Z2 and the distance Z1 (Z2−Z1) may be smaller than the distance Z1. Accordingly, an electric field intensity can be reduced, and a breakdown voltage is thus improved.

By providing the embedded dielectric films 95 among the guard rings 92, a diffusion of ions of phosphorus or the like forming the guard rings 92 within the XY plane is suppressed by the embedded dielectric films 95, and a width of each of the guard rings 92 (the width in the X axis direction in the example of FIG. 3) becomes small. For example, when impurity ions are implanted between two embedded dielectric films 95 at a depth position shallower than that of the embedded dielectric film 95 and subjected to heat treatment, at least a part of the impurities are diffused in the X axis direction after diffusing to a position deeper than that of the embedded dielectric films 95. Therefore, the diffusion of impurities in the X axis direction is suppressed.

Further, by providing the embedded dielectric films 95, the end portions 203 of the guard rings 92 come into contact with the embedded dielectric films 95 without being exposed on the upper surface 21. As a comparative example, the guard ring 92 when the embedded dielectric films 95 do not exist is illustrated in dashes. An end portion 204 of the guard ring 92 when the embedded dielectric films 95 do not exist is exposed on the upper surface 21. By providing the embedded dielectric films 95 as shown in FIG. 4, the end portions 203 of the guard rings 92 in the X axis direction can be arranged on the lower side of the upper surface 21 of the semiconductor substrate 10. Since the width of the guard rings 92 increases as a distance from the upper surface 21 of the semiconductor substrate 10 decreases, by arranging the end portions 203 on the lower side of the upper surface 21, the width of the guard rings 92 in the X axis direction can be reduced. A reduction amount of the width of the guard rings 92 can be adjusted by the thickness Z1 of the embedded dielectric films 95.

By reducing the width of the guard rings 92, it becomes possible to design intervals among the guard rings 92 small while maintaining the breakdown voltage and thus set the width of the edge termination structure portion 90 small. Accordingly, the semiconductor device 100 can be miniaturized. That is, according to the semiconductor device 100, by providing the embedded dielectric films 95, it becomes possible to improve flatness of the upper surface 21 of the semiconductor substrate 10 and miniaturize the semiconductor device 100 within the XY plane.

The embedded dielectric film 95 of this example includes a flat portion 201 and an end portion 202. The flat portion 201 is a region that includes a lower end of the embedded dielectric film 95 and has a substantially constant depth. Of the embedded dielectric film 95, the flat portion 201 may be a region having a depth of 0.5×Z1 or more, a region having a depth of 0.7×Z1 or more, or a region having a depth of 0.9×Z1 or more. The end portion 202 is a region that is arranged on the outer side of the flat portion 201 and has a smaller depth than the flat portion 201. The end portion 202 may include a portion in which the depth gradually decreases toward the outside. The end portion 203 of the guard ring 92 may be in contact with the flat portion 201. Accordingly, variations in the width of the guard rings 92 can be suppressed.

The depth Z1 from the upper surface 21 of the semiconductor substrate 10 to the lower end of the embedded dielectric film 95 may be 0.3 μm or more. By increasing the depth Z1, the width of the guard rings 92 can be reduced. The depth Z1 may be 1 μm or more or 2 μm or more. If the depth Z1 becomes too large, it becomes difficult to form the embedded dielectric film 95 flat. The depth Z1 may be 3 μm or less, 2 μm or less, or 1 μm or less.

Figure 5:
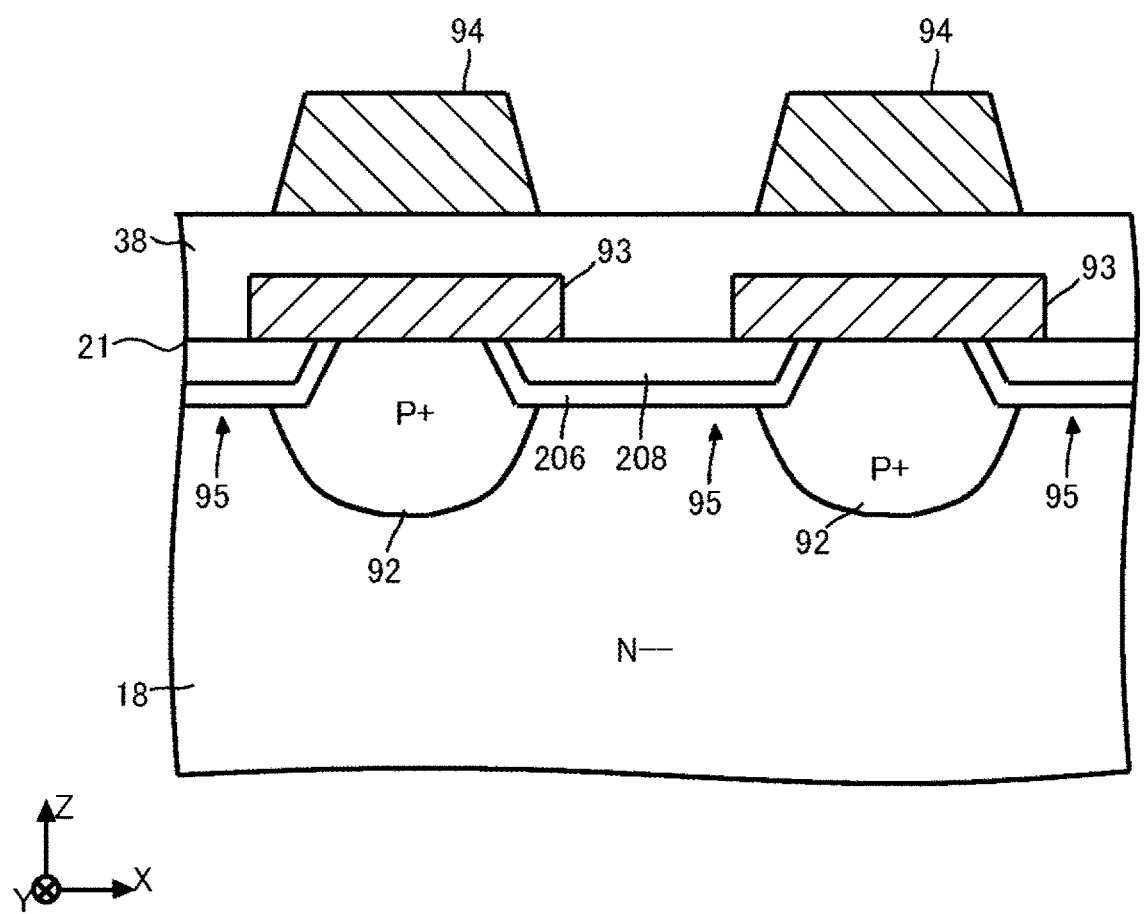
FIG. 5 shows another configuration example of the embedded dielectric films 95.

FIG. 5 shows another configuration example of the embedded dielectric film 95. The embedded dielectric film 95 of this example includes a first dielectric film 206 and a second dielectric film 208. The first dielectric film 206 is in contact with the semiconductor substrate 10. The first dielectric film 206 is a film obtained by oxidizing or nitriding the semiconductor substrate 10, for example. The second dielectric film 208 is laminated on the first dielectric film 206. The second dielectric film 208 is a deposited film formed by a CVD method, for example. Since the embedded dielectric film 95 has the laminated structure, the embedded dielectric film 95 having a large thickness Z1 can be formed with ease. Therefore, the width of the guard rings 92 can be reduced with ease.

Figure 6:
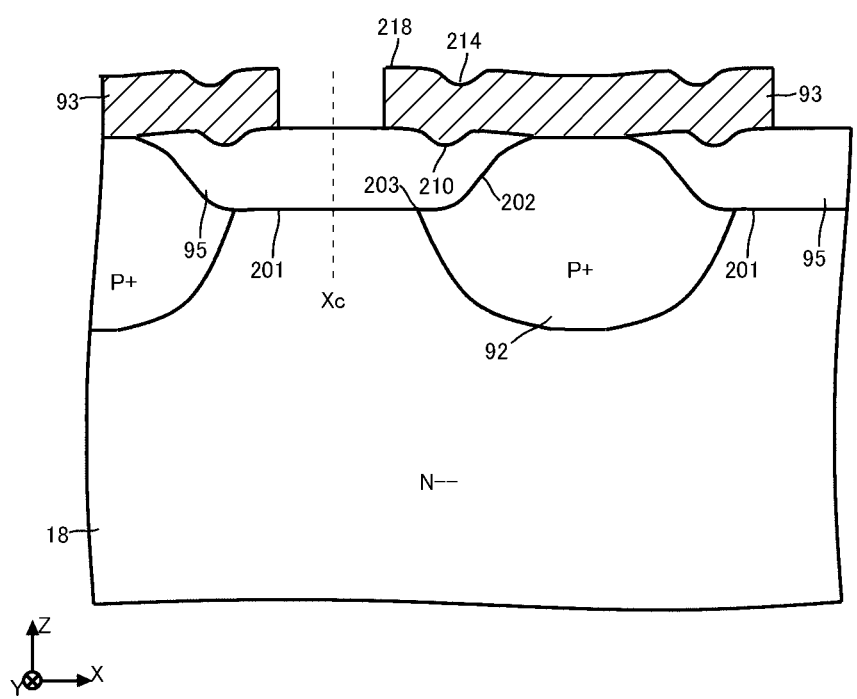
FIG. 6 shows exemplary shapes of the embedded dielectric films 95 and field plates 93.

FIG. 6 shows exemplary shapes of the embedded dielectric films 95 and the field plates 93. When a recess is formed on the upper surface 21 of the semiconductor substrate 10 and the recess is thermally oxidized to form the embedded dielectric film 95, valley portions 210 may sometimes be generated on the upper surface of the embedded dielectric film 95. The valley portion 210 is a downwardly concaved portion. For example, the valley portion 210 may be generated by a portion where a dielectric film that develops from a bottom surface of the recess intersects with a dielectric film that develops from side surfaces. At least a part of the valley portion 210 may be formed on an upper surface of the end portion 202 of the embedded dielectric film 95.

The field plate 93 of this example includes valley portions 214 at positions overlapping with the embedded dielectric films 95. The valley portion 214 is a portion that is provided on an upper surface of the field plate 93 and is concaved toward the upper surface 21 of the semiconductor substrate 10. The field plate 93 of this example includes an extension portion 218 that extends more toward the center of the embedded dielectric film 95 (a position Xc in this example) than the valley portion 214. The position Xc is a center of the embedded dielectric film 95 in a radial direction of the embedded dielectric films 95 enclosing the active portion 160 (the X axis direction in FIG. 6). The extension portion 218 may be extended more toward the position Xc side than toward the valley portion 210.

The extension portion 218 of any of the field plates 93 may be extended while exceeding the position Xc. For example, the extension portion 218 including an end portion of the field plate 93 on the active portion 160 side may be extended while exceeding the position Xc.

Figure 7:
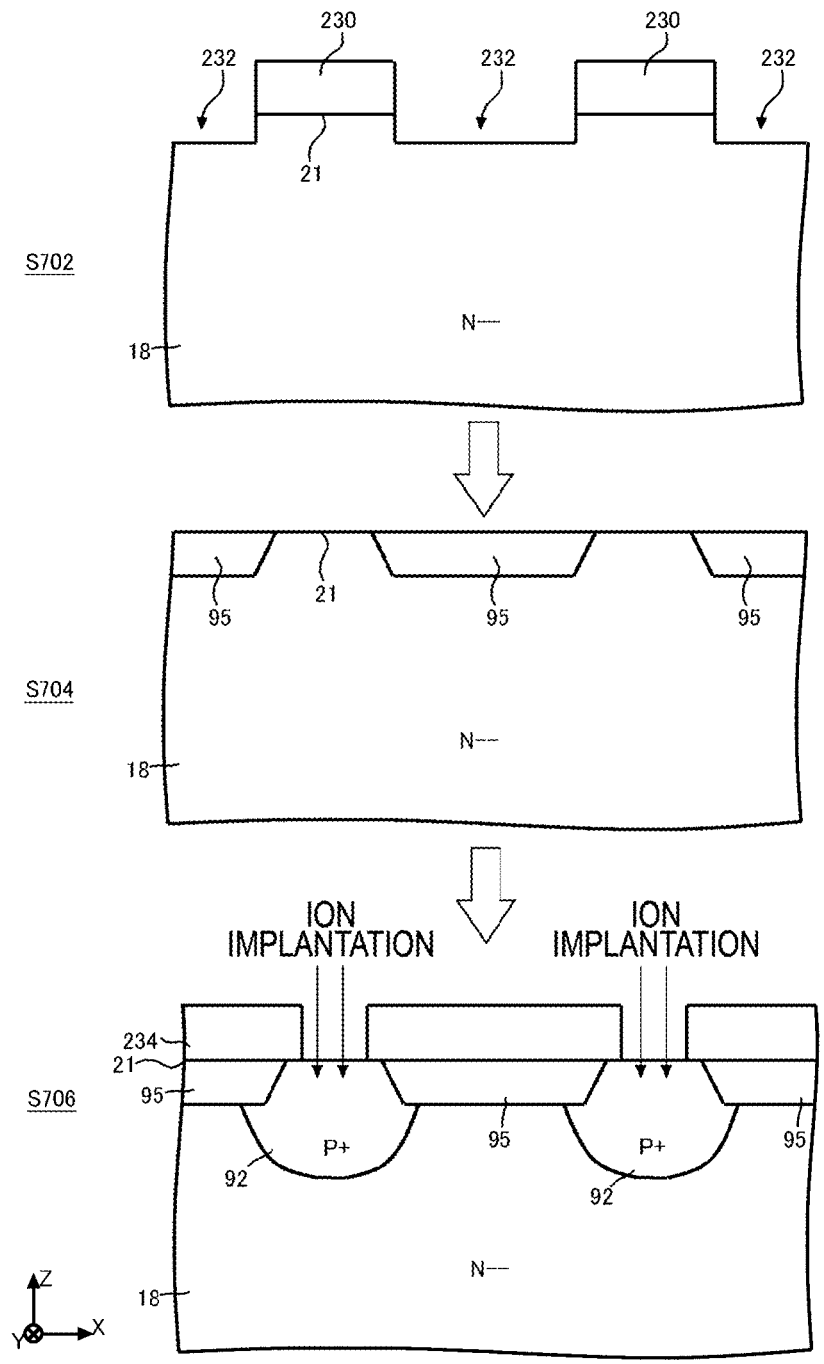
FIG. 7 shows some processes of a manufacturing method of the semiconductor device 100.

FIG. 7 shows some processes of a manufacturing method of the semiconductor device 100. In a recess formation step S702, recesses 232 are formed on the upper surface 21 of the semiconductor substrate 10. The recess 232 is formed between regions where two guard rings 92 are to be formed in the edge termination structure portion 90. In the example of FIG. 7, masks 230 are selectively formed on the upper surface 21 of the semiconductor substrate 10, and the recesses 232 are formed on the upper surface 21 of the semiconductor substrate 10 at portions not covered by the masks 230. The mask 230 may include at least one of an oxide film, a nitride film, or a resist film. In this example, after forming an initial oxide film on the upper surface 21 of the semiconductor substrate 10, a nitride film is formed by a CVD method. A photoresist is applied onto the nitride film and is exposed in a predetermined pattern. The photoresist, the nitride film, and the initial oxide film are selectively removed after the exposure to thus form the mask 230.

Next, in a dielectric film formation step S704, the upper surface 21 of the semiconductor substrate 10 is oxidized. In S704, the upper surface 21 of the semiconductor substrate 10 is oxidized in a state where the masks 230 remain. Since the oxidation of the upper surface 21 of the semiconductor substrate 10 does not proceed at portions covered by the masks 230, the embedded dielectric films 95 can be selectively formed in the recesses 232. After forming the embedded dielectric films 95, the masks 230 are removed. An upper end of the embedded dielectric film 95 is preferably at the same height position as the upper surface 21 of the semiconductor substrate 10, though not limited thereto.

Next, in an implantation step S706, ions of a P type dopant are implanted into the upper surface 21 of the semiconductor substrate 10. The P type dopant is, for example, boron. In S706, the ions are implanted in a state where a mask 234 is formed on the upper surface 21 of the semiconductor substrate 10. The mask 234 includes apertures in regions where the guard rings 92 are to be formed. In this example, the ions are implanted between two of the embedded dielectric films 95. Accordingly, the ions can be selectively implanted into the regions where the guard rings 92 are to be formed. After implanting the ions, the semiconductor substrate 10 is annealed to thus form the guard rings 92. An anneal temperature may be 1000° C. or more and 1200° C. or less. An anneal time may be 1 hour or more and 12 hours or less. By performing annealing for a long time at a high temperature, the guard rings 92 that protrude up to below the embedded dielectric films 95 can be formed.

Note that an implantation depth of the P type dopant in S706 may be closer to the upper surface 21 side than the lower end of the embedded dielectric films 95. By implanting the P type dopant to be shallower than the embedded dielectric films 95, a diffusion of the P type dopant in the X axis direction is suppressed by the embedded dielectric films 95. Accordingly, the width of the guard rings 92 in the X axis direction can be reduced. Further, as described with reference to FIG. 4, due to the existence of the embedded dielectric films 95, the end portions 203 of the guard rings 92 are arranged on the lower side of the upper surface 21. Also with this structure, the width of the guard rings 92 in the X axis direction can be reduced. In the manufacturing method of this example, the width of the edge termination structure portion 90 can be designed small in view of the reduction of the width of the guard rings 92.

Although the implantation step S706 is carried out after the recess formation step S702 and the dielectric film formation step S704 in the example of FIG. 7, the recess formation step S702 and the dielectric film formation step S704 may be carried out after the guard rings 92 are formed in the implantation step S706. Also in this case, since the end portions 204 of the guard rings 92 that have been described with reference to FIG. 4 are removed in the recess formation step S702, the width of the guard rings 92 can be reduced.

Figure 8:
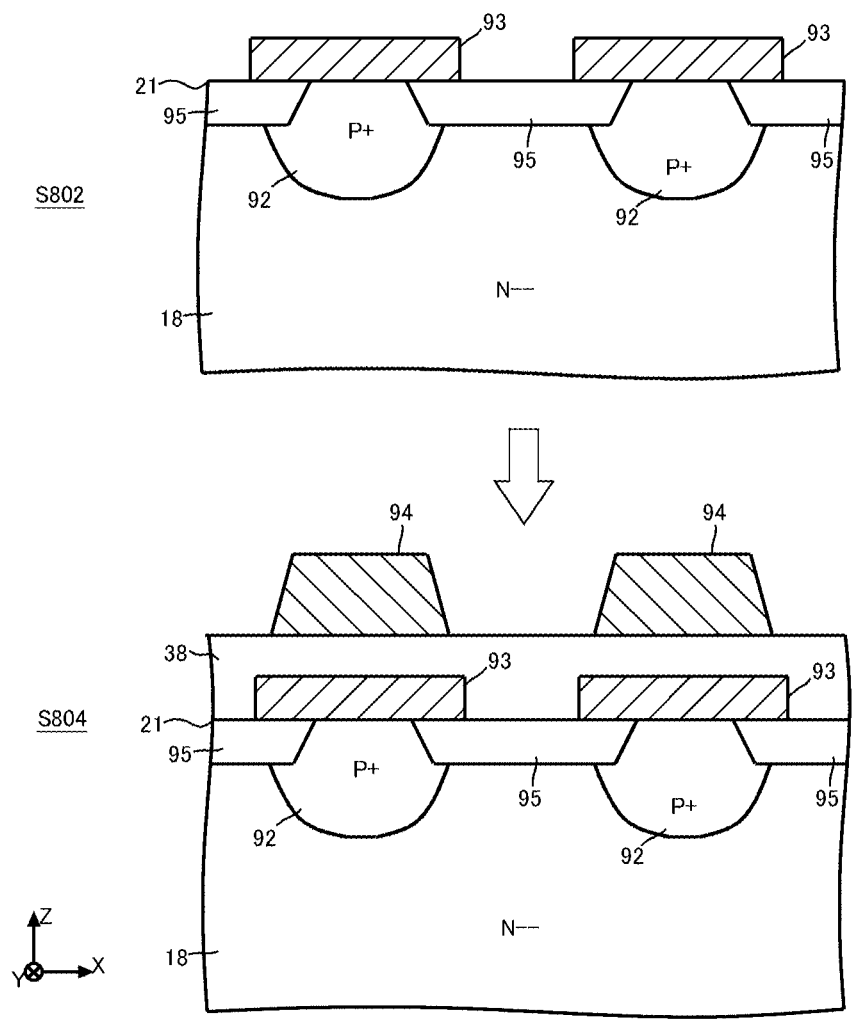
FIG. 8 shows manufacturing processes that are carried out after the manufacturing processes shown in FIG. 7.

FIG. 8 shows manufacturing processes that are carried out after the manufacturing processes shown in FIG. 7. After the embedded dielectric films 95 and the guard rings 92 are formed, the field plates 93 are formed above the guard rings 92 in a field plate formation step S802. An oxide film that covers the upper surface 21 of the semiconductor substrate 10 may be formed before forming the field plates 93. The oxide film may be formed by the same process as the gate dielectric film 42. In addition, in S802, at least a part of other portions formed of polysilicon (e.g., the gate conductive portions 44, the dummy conductive portions 34, the gate runner such as the outer circumferential gate runner 130-2, the outer plate 96, etc.) may also be formed. Note that a partial formation process of the active portion 160 may be provided between the implantation step S706 and the field plate formation step S802. The partial formation process of the active portion 160 may be, for example, a trench portion formation process or the like.

Next, in a field electrode formation step S804, the field electrodes 94 are formed above the field plates 93. It is preferable to form the interlayer dielectric film 38 before forming the field electrodes 94. In S804, at least a part of other portions formed of a metal material (e.g., the emitter electrode 52, the gate runner such as the outer circumferential gate runner 130-1, the outer electrode 97, etc.) may also be formed. Note that other formation processes of the active portion 160 may be provided between the field plate formation step S802 and the field electrode formation step S804. The other formation processes of the active portion 160 may be, for example, formation processes of the base region, the emitter region, the contact region, or the like. The semiconductor device 100 can be manufactured by such processes.

FIG. 9 shows an example of the cross section C-C in FIG. 1. The cross section C-C is a cross section perpendicular to the XY plane in the vicinity of the corner of the semiconductor substrate 10. As described above, the field plates 93 and the field electrodes 94 are connected via the contact holes 240 provided in the interlayer dielectric film 38. In addition, the field electrodes 94 and the guard rings 92 are also connected via the contact holes 240 provided in the interlayer dielectric film 38. The guard ring 92 may include a P++ type contact region 242 that has a higher concentration than other portions, in a region that is in contact with the contact hole 240.

The field plate 93 may include an aperture for the contact hole 240 that connects the field electrode 94 and the guard ring 92 to pass through. Further, the outer electrode 97 and the outer plate 96 are also connected via the contact hole 240 provided in the interlayer dielectric film 38. A metal material such as aluminum and tungsten may be filled inside these contact holes 240. These contact holes 240 may be provided in the vicinity of four corners of the semiconductor substrate 10.

The channel stopper 98 may be connected to the outer electrode 97 via the contact hole 240. The outer electrode 97 may be connected to the outer plate 96 via the contact hole. The contact region 242 may be provided on an upper surface of the channel stopper 98 below the contact hole 240. A dielectric film (not shown) may be provided between the outer plate 96 and the channel stopper 98. A potential of the channel stopper 98 is the same as the potential of the collector electrode 24. In the vicinity of the four corners of the semiconductor substrate 10, the potential of the outer electrode 97 or the outer plate 96 is set to be identical to the potential of the channel stopper 98. Accordingly, the outer electrode 97 formed in a ring shape can prevent the depletion layer from reaching an end surface of the semiconductor substrate.

Figure 10:
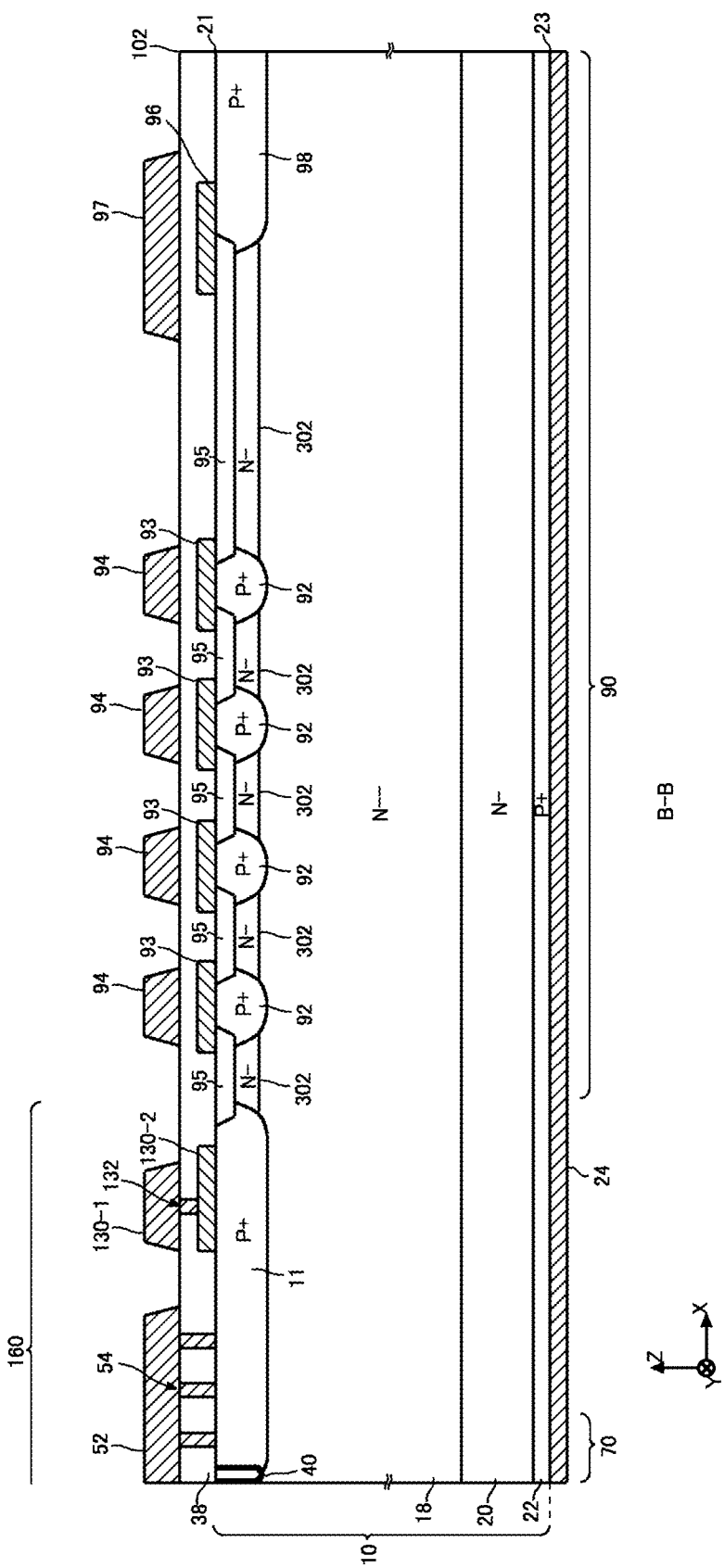
FIG. 10 shows another example of the cross section B-B.

FIG. 10 shows another example of the cross section B-B. Both the dopant of the first conductivity type (e.g., phosphorus) and the dopant of the second conductivity type (e.g., boron) are distributed in the entire semiconductor substrate 10 of this example. The dopant concentration of the first conductivity type is higher than the dopant concentration of the second conductivity type. That is, the semiconductor substrate 10 is a substrate of the first conductivity type (the N type in this example).

The semiconductor device 100 of this example further includes high concentration regions 302 with respect to any of the forms described above with reference to FIGS. 1 to 10. Below the dielectric films provided on the upper surface 21 of the semiconductor substrate 10, the high concentration regions 302 are provided while being in contact with the dielectric films. The dielectric films of this example are the embedded dielectric films 95. The high concentration region 302 is an N− type region having a higher doping concentration than the drift region 18.

The high concentration regions 302 may cover the lower surfaces of the dielectric films provided on the upper surface 21 of the semiconductor substrate 10 so that the dielectric films do not come into direct contact with the drift region 18. The high concentration region 302 does not need to be provided on the lower surface of the dielectric film that is covered by the region having a higher doping concentration than the drift region 18 (e.g., the guard ring 92, the well region 11, etc.). The high concentration region 302 of this example is provided between two guard rings 92. The high concentration region 302 may be provided also between the guard ring 92 at the outermost circumference and the channel stopper 98. The high concentration region 302 may be provided also between the guard ring 92 at the innermost circumference and the well region 11.

Figure 11:
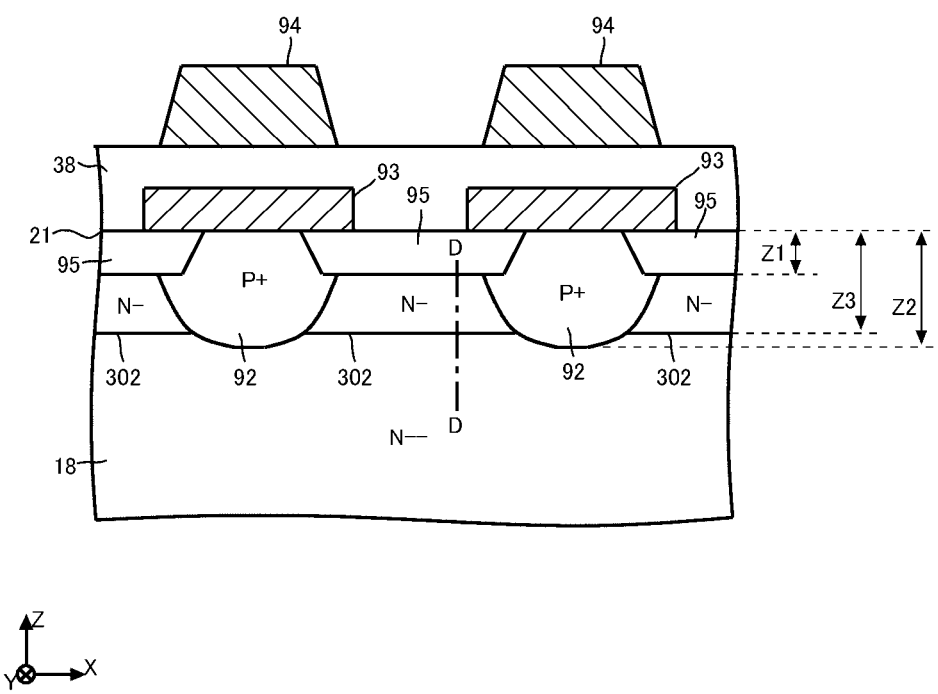
FIG. 11 shows an enlarged diagram showing a vicinity of high concentration regions 302.

FIG. 11 shows an enlarged diagram showing a vicinity of the high concentration regions 302. A distance between the upper surface 21 of the semiconductor substrate 10 and a lower end of the high concentration region 302 in the depth direction is indicated by Z3. The distance Z3 is larger than the distance Z1. The distance Z3 may be smaller than or the same as the distance Z2, or may be larger than the distance Z2. In the example of FIG. 11, the distance Z3 is slightly smaller than the distance Z2. The distance Z3 may be smaller than 1 time the distance Z2 or may be 0.9 time or less. The distance Z3 may be 0.5 time the distance Z2 or more, or may be 0.7 time or more.

Figure 12:
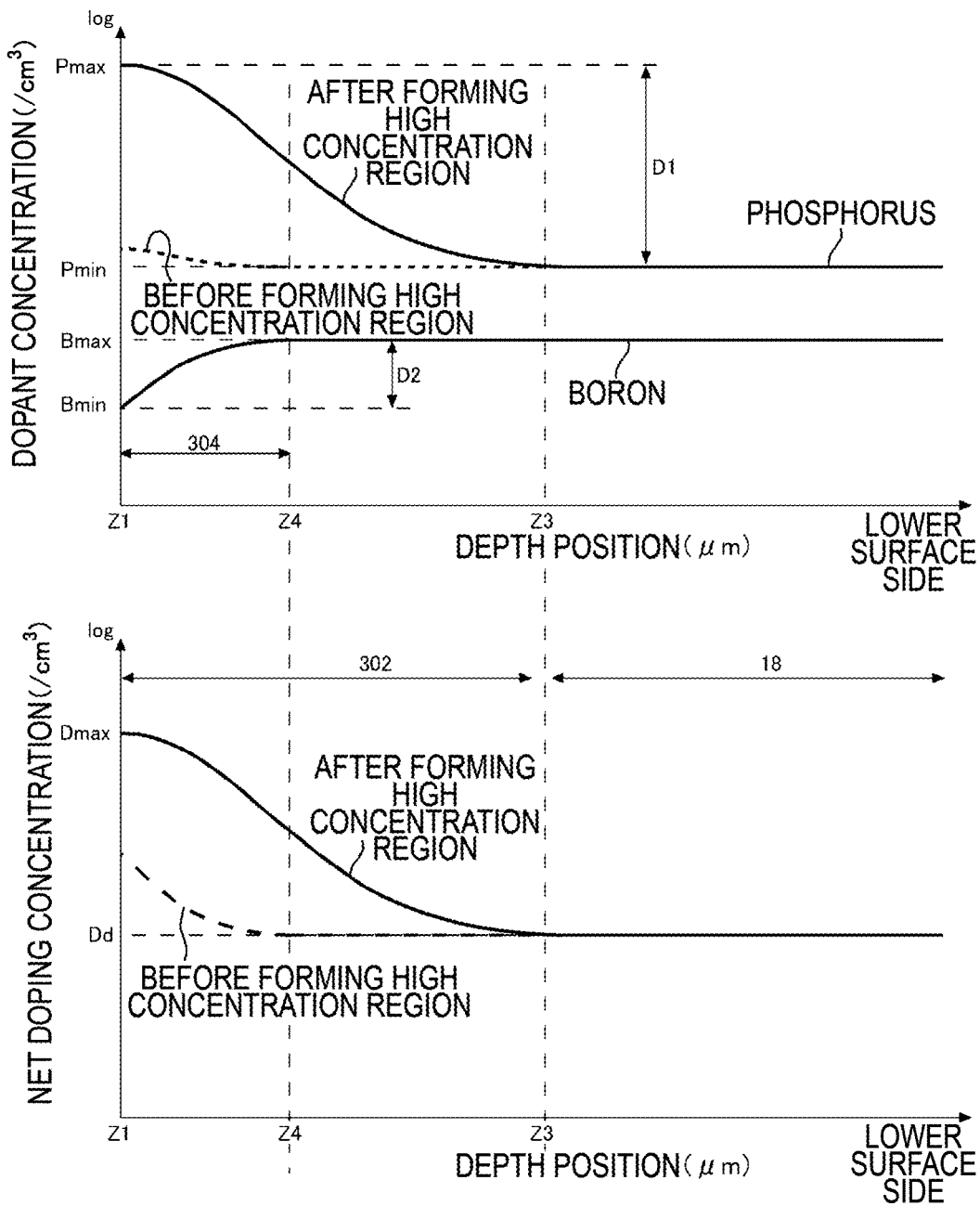
FIG. 12 shows distribution examples of a concentration of an N type dopant, a concentration of a P type dopant, and a net doping concentration in a line D-D of FIG. 11.

FIG. 12 shows distribution examples of the concentration of the N type dopant, the concentration of the P type dopant, and the net doping concentration in a line D-D of FIG. 11. The line D-D is parallel to the Z axis and passes the high concentration region 302 and a part of the drift region 18. The N type dopant in this example is phosphorus, and the P type dopant is boron. Horizontal axes in FIG. 12 each represent a depth position with the upper surface 21 of the semiconductor substrate 10 being a reference. Note that the depth position Z1 of the lower end of the embedded dielectric film 95 is used as origins of the horizontal axes.

As described above, both phosphorus and boron are distributed in the entire semiconductor substrate 10. An overall doping concentration of the semiconductor substrate 10 is adjusted by a concentration difference between phosphorus and boron. In a region where phosphorus and boron are not locally implanted, the concentrations of phosphorus and boron become substantially constant in the entire semiconductor substrate 10.

Note that in some cases, in the vicinity of the dielectric films, impurities included in the semiconductor substrate 10 may be absorbed by the dielectric films or be segregated to thus cause a change in the impurity concentration. In the example of FIG. 12, in the process of the thermal oxidation for forming the embedded dielectric films 95, or the like, the embedded dielectric films 95 develop while taking in boron in vicinal regions. Therefore, boron concentrations in the vicinal regions of the embedded dielectric films 95 decrease toward the embedded dielectric films 95. In addition, the embedded dielectric films 95 develop while sweeping out phosphorus to the vicinal regions. Therefore, phosphorus concentrations in the vicinal regions of the embedded dielectric films 95 increase toward boundaries with the embedded dielectric films 95. In FIG. 12, the phosphorus concentration distribution and net doping concentration distribution before forming the high concentration regions 302 are indicated by dashes, and the phosphorus concentration distribution and net doping concentration distribution after forming the high concentration regions 302 are indicated by solid lines.

Since the phosphorus concentration increases and the boron concentration decreases in the vicinity of the embedded dielectric films 95, the net doping concentration of the N type regions increases. Therefore, in the N type semiconductor substrate 10 in which the P type dopant such as boron is distributed in the entire substrate, the net doping concentration of the N type regions in the vicinity of the embedded dielectric films 95 largely increases. Since the rise of the net doping concentration varies depending on the manufacturing processes, variations in the net doping concentration in the vicinity of the embedded dielectric films 95 become large.

In this example, the N type high concentration regions 302 are formed while being in contact with the embedded dielectric films 95. The dopant concentration of the high concentration regions 302 can be controlled relatively accurately based on an ion implantation amount and the like. Therefore, the dopant concentration in the regions below the embedded dielectric films 95 includes not only components that vary due to the absorption of impurities and the like but also components that can be controlled accurately. Therefore, controllability of the net doping concentration in the regions below the embedded dielectric films 95 can be improved.

In this example, a region that is in contact with the embedded dielectric film 95 below the embedded dielectric film 95, in which the concentration of the dopant of the second conductivity type (boron in this example) decreases monotonically toward the embedded dielectric film 95, is referred to as fall off region 304. That is, in the fall off region 304, the dopant concentration of the second conductivity type decreases as the distance from the embedded dielectric film 95 decreases. The high concentration regions 302 and the fall off regions 304 may be provided in the edge termination structure portion 90.

A maximum value of the boron concentration in the fall off region 304 is indicated by Bmax, and a minimum value is indicated by Bmin. The concentration Bmax may be the same as the boron concentration in the drift region 18. Note that the respective concentrations at the center of the semiconductor substrate 10 in the depth direction may be used as the respective concentrations in the drift region 18. Further, an average value of the respective concentrations in a region that includes the center of the semiconductor substrate 10 in the depth direction and has a predetermined width in the depth direction may be used as the respective concentrations in the drift region 18. The predetermined width may be, for example, 10 μm or 20 μm. The concentration Bmin may be a boron concentration at the boundary with the embedded dielectric film 95. A difference between the concentration Bmax and the concentration Bmin is indicated by D2.

Further, a lower end position of the fall off region 304 is indicated by Z4. The position Z4 is a position at which the boron concentration starts to decrease from the concentration Bmax in the drift region 18. When the position at which the concentration starts to decrease is indefinite, a position at which the boron concentration becomes 0.9×Bmax in a direction from the drift region 18 to the embedded dielectric film 95 may be set as the position Z4.

A maximum value of the phosphorus concentration in the high concentration region 302 is indicated by Pmax, and a minimum value is indicated by Pmin. The concentration Pmin may be the same as the phosphorus concentration in the drift region 18. The concentration Pmax may be a phosphorus concentration at the boundary with the embedded dielectric film 95. A difference between the concentration Pmax and the concentration Pmin is indicated by D1.

In addition, a lower end position of the high concentration region 302 is indicated by Z3. The position Z3 is a position at which the net doping concentration starts to increase from the concentration Dd in the drift region 18. When the position at which the concentration starts to increase is indefinite, a position at which the net doping concentration becomes 1.1×Dd in the direction from the drift region 18 to the embedded dielectric film 95 may be set as the position Z3.

As described above, the difference D1 of the phosphorus concentration in the high concentration region 302 can be controlled relatively accurately based on the ion implantation amount and the like. On the other hand, the difference D2 of the boron concentration in the fall off region 304 largely varies in the manufacturing processes. The controllability of the net doping concentration in the regions in the vicinity of the embedded dielectric films 95 is improved by increasing a ratio of the dopant concentration that can be controlled accurately (the difference D1 in this example). The difference D1 of the phosphorus concentration in the high concentration region 302 is preferably larger than the difference D2 of the boron concentration in the fall off region 304. The difference D1 may be 2 times or more, 5 times or more, or 10 times or more of the difference D2.

On the other hand, when the phosphorus concentration of the high concentration region 302 becomes too high, the doping concentrations of the adjacent guard rings 92 are affected. The maximum value Dmax of the net doping concentration of the high concentration region 302 may be smaller than a maximum value of the net doping concentration of the guard ring 92. The maximum value Dmax of the net doping concentration of the high concentration region 302 may be 1/10 or less or 1/00 or less of a maximum value of the net doping concentration of the guard ring 92.

Furthermore, the maximum value Dmax of the net doping concentration of the high concentration region 302 may be 10 times or more, 20 times or more, 50 times or more, or 100 times or more of the net doping concentration Dd in the drift region 18. The maximum value Dmax of the net doping concentration of the high concentration region 302 may be $1\times10^{14}/cm^3$ or more, $5\times10^{14}/cm^3$ or more, or $1\times10^{15}/cm^3$ or more.

In addition, the high concentration region 302 is preferably provided up to below the fall off region 304. That is, the position Z3 is preferably arranged closer to the lower surface 23 side than the position Z4. Accordingly, variations of the net doping concentration in the fall off region 304 can be reduced. The width of the high concentration region 302 in the depth direction (Z3−Z1) may be 1.5 times or more, 2 times or more, or 5 times or more of the width of the fall off region 304 in the depth direction (Z4−Z1). As shown in FIG. 11, the lower end of the high concentration region 302 may be arranged closer to the upper surface 21 side of the semiconductor substrate 10 than the lower end of the guard ring 92.

Figure 13:
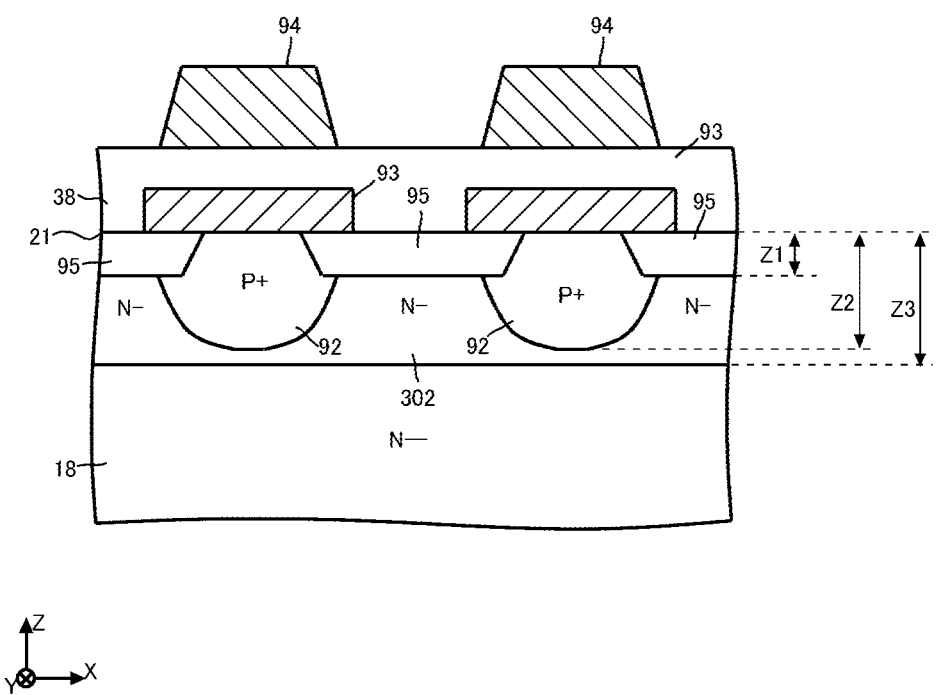
FIG. 13 shows another example of the high concentration region 302.

FIG. 13 shows another example of the high concentration region 302. The lower end of the high concentration region 302 of this example is arranged closer to the lower surface 23 side of the semiconductor substrate 10 than the lower ends of the guard rings 92. That is, the distance Z3 from the upper surface 21 to the lower end of the high concentration region 302 is larger than the distance Z2 from the upper surface 21 to the lower end of the guard ring 92. The high concentration region 302 may also be provided in the active portion 160, or does not need to be provided.

Figure 14:
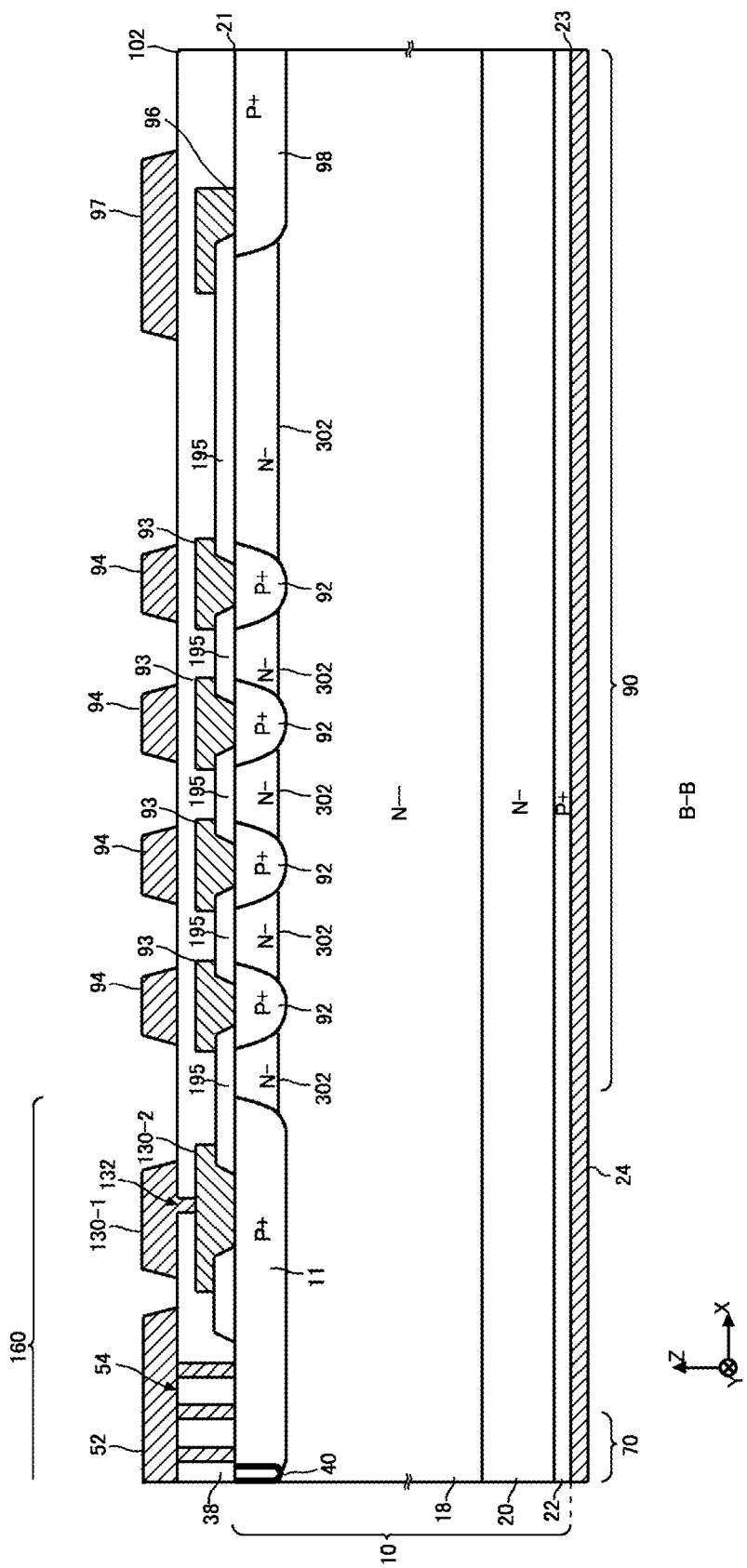
FIG. 14 shows another example of the cross section B-B.

FIG. 14 shows another example of the cross section B-B. The semiconductor device 100 of this example includes dielectric films 195 in place of the embedded dielectric films 95 in any of the configurations described with reference to FIGS. 10 to 13. The dielectric film 195 is, for example, a thermally oxidized film. Other structures are the same as any of the configurations described with reference to FIGS. 10 to 13.

The dielectric films 195 are provided on the upper surface 21 of the semiconductor substrate 10. Positions at which the dielectric films 195 are provided in the XY plane are similar to those of the embedded dielectric films 95. That is, the dielectric film 195 is arranged between two guard rings 92 within the XY plane. At least a part of the dielectric film 195 is provided on the upper side of the upper surface 21 of the semiconductor substrate 10. The entire dielectric film 195 may be provided on the upper side of the upper surface 21 of the semiconductor substrate 10. The guard rings 92 are formed to reach positions below the dielectric films 195. Further, similar to the example of FIG. 5, the dielectric films 195 may each be a film obtained by laminating the first dielectric film and the second dielectric film.

The high concentration regions 302 are in contact with the dielectric films 195 below the dielectric films 195. The high concentration regions 302 of this example are exposed on the upper surface 21 of the semiconductor substrate 10. The dielectric films 195 cover the high concentration regions 302 exposed on the upper surface 21. The fall off region 304 described with reference to FIG. 12 is formed below the dielectric films 195. By providing the high concentration regions 302 also in this example, the effect of variations in the net doping concentration due to the fall off region 304 can be reduced.

Figure 15:
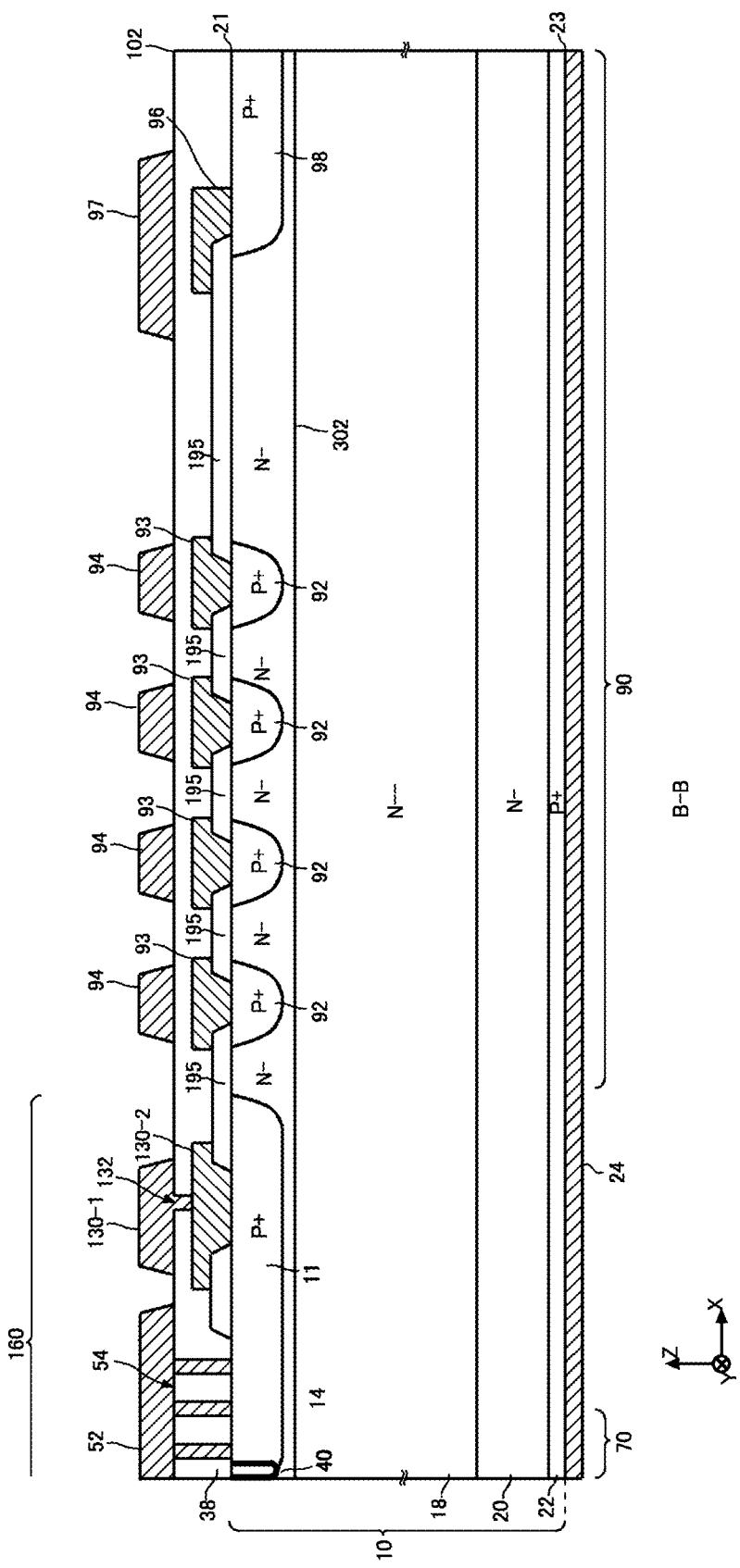
FIG. 15 shows another example of the cross section B-B.

FIG. 15 shows another example of the cross section B-B. The structure of the high concentration region 302 differs from that of the configuration shown in FIG. 14. Other structures are similar to those of the example shown in FIG. 14. The high concentration region 302 of this example includes a structure similar to that of the high concentration region 302 described with reference to FIG. 13. That is, the high concentration region 302 of this example is formed to be deeper than the guard rings 92. By providing the high concentration region 302 also in this example, the effect of variations in the net doping concentration due to the fall off region 304 can be reduced.

Figure 16:
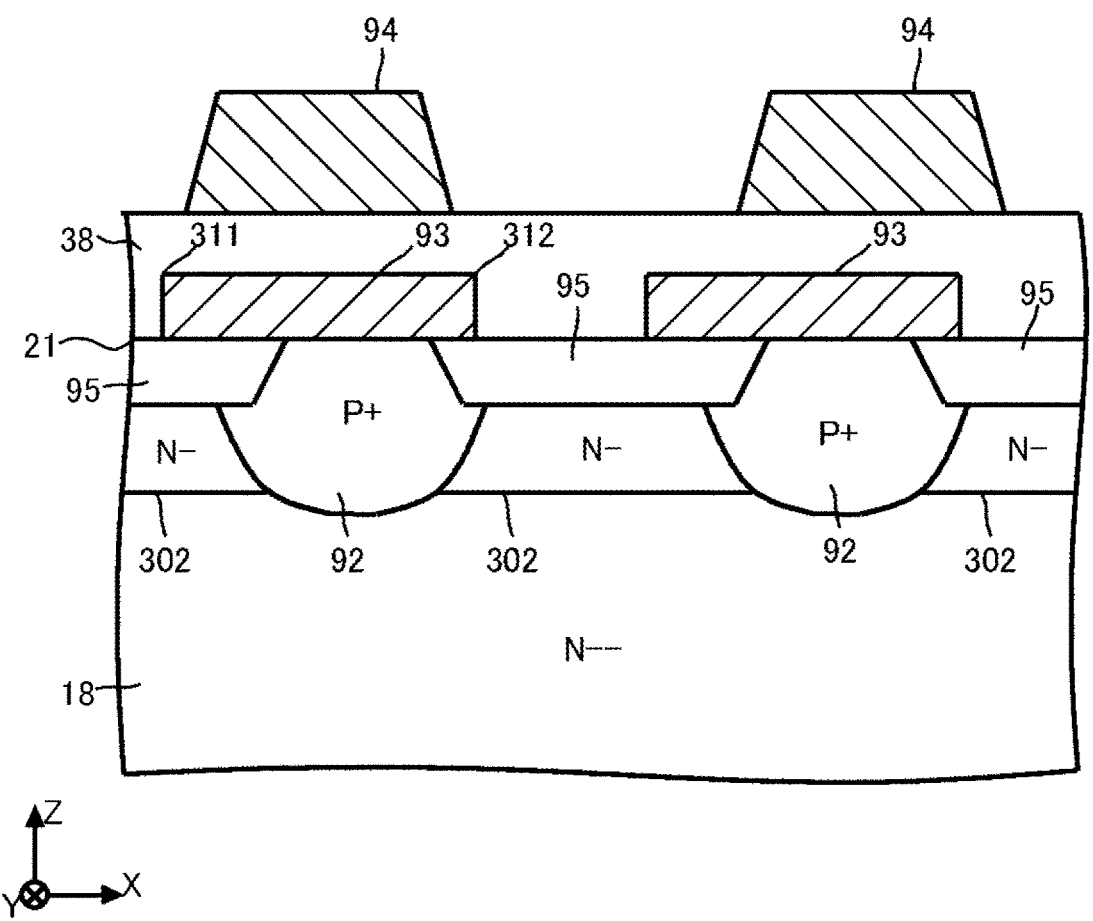
FIG. 16 shows an exemplary arrangement of the field plates 93.

FIG. 16 shows an exemplary arrangement of the field plates 93. The field plates 93 of this example are arranged while being deviated toward the active portion 160 side with respect to the guard rings 92 provided below. For example, a center position of the field plate 93 is arranged closer to the active portion 160 side than a center position of the guard ring 92 in the X axis direction.

In this example, of the end portions of the field plate 93, the end portion on the active portion 160 side is referred to as end portion 311, and the end portion on the end side 102 side is referred to as end portion 312. The end portion 311 may be arranged closer to the active portion 160 side than the guard ring 92. The end portion 312 may be arranged at a position that overlaps with the guard ring 92. At least one of the field plates 93 may be arranged as shown in FIG. 16, or all of the field plates 93 may be arranged as shown in FIG. 16. The arrangement of the field plates 93 in this example may be applied to any of the forms shown in FIGS. 1 to 15.

Figure 17:
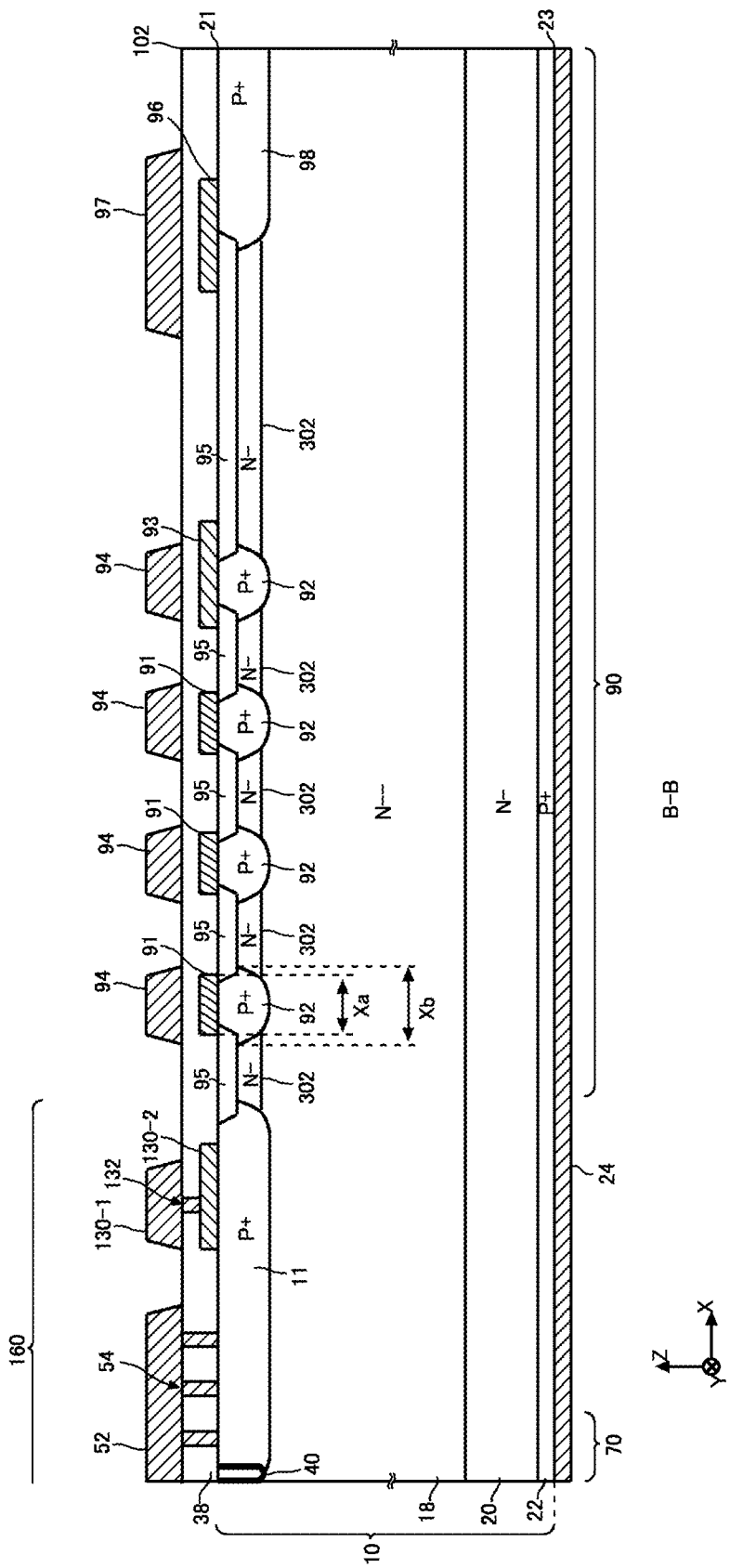
FIG. 17 shows another example of the cross section B-B.

FIG. 17 shows another example of the cross section B-B. The edge termination structure portion 90 of this example includes a structure in which at least one of the field plates 93 of the edge termination structure portion 90 shown in FIGS. 1 to 16 is replaced with a guard ring electrode 91. Other structures are similar to those of the edge termination structure portion 90 in any of the aspects described with reference to FIGS. 1 to 16. A material of the guard ring electrode 91 is similar to that of the field plate 93. As an example, the guard ring electrode 91 is formed of polysilicon. Similar to the field plates 93 shown in FIG. 3, each of the guard ring electrodes 91 is connected to the field electrode 94 via the contact hole provided in the interlayer dielectric film 38.

The width of the field plate 93 shown in FIGS. 1 to 16 in the X axis direction may be larger than the width of the guard ring 92 in the X axis direction. That is, in a top view, the field plate 93 covers a wider range than the guard ring 92 in either or both of the active portion 160 side or/and the end side 102 side of the semiconductor substrate 10. Meanwhile, a width Xa of the guard ring electrode 91 in the X axis direction is smaller than a width Xb of the guard ring 92 to which the guard ring electrode 91 is connected in the X axis direction. In a top view, the entire guard ring electrode 91 overlaps with the guard ring 92.

The guard ring electrode 91 may be provided with respect to all of the guard rings 92, or the guard ring electrode 91 may be provided with respect to a part of the guard rings 92 so that the field plate 93 is provided with respect to the rest of the guard rings 92. As an example, the guard ring electrode 91 may be provided with respect to one or more guard rings 92 arranged on the active portion 160 side, and the field plate 93 may be provided with respect to one or more guard rings 92 arranged on the end side 102 side of the semiconductor substrate 10. In the example of FIG. 17, the field plate 93 is provided with respect to the guard ring 92 at the outermost circumference, and the guard ring electrodes 91 are provided with respect to the other guard rings 92.

Figure 18:
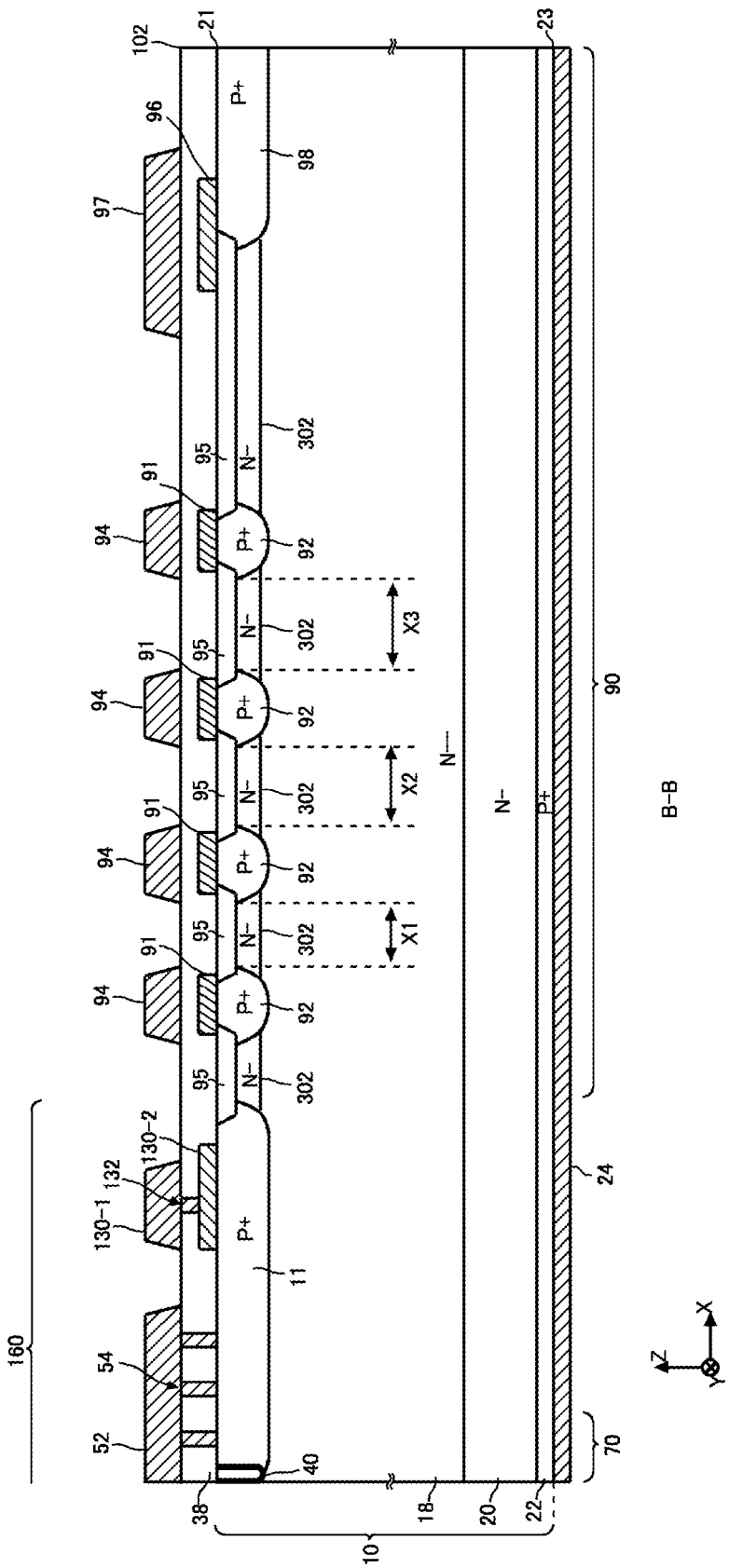
FIG. 18 shows another example of the cross section B-B.

FIG. 18 shows another example of the cross section B-B. The edge termination structure portion 90 of this example differs from that of the examples shown in FIGS. 1 to 17 in that intervals (X1, X2, X3) of the guard rings 92 in the X axis direction increase as a distance from the end side 102 of the semiconductor substrate 10 decreases. Other structures are similar to those in any of the aspects described with reference to FIGS. 1 to 17. FIG. 18 shows an example in which the intervals of the guard rings 92 become wider toward the outside in the structure shown in FIG. 17. In this example, the guard ring electrode 91 is also provided with respect to the guard ring 92 at the outermost circumference.

The doping concentrations of the high concentration regions 302 arranged among the respective guard rings 92 may mutually be the same. In another example, the doping concentrations of the high concentration regions 302 arranged among the respective guard rings 92 may increase along with the increase of the intervals of the guard rings 92. When the intervals of the guard rings 92 become large, an area of portions where the dielectric films such as the embedded dielectric films 95 come into contact with the semiconductor substrate 10 becomes large. In this case, variations in the phosphorus concentration and the boron concentration in the vicinity of the dielectric films such as the embedded dielectric films 95 are likely to become large. By raising the doping concentrations of the high concentration regions 302 according to the intervals of the guard rings 92, an effect of the variations in the phosphorus concentration and the boron concentration on the breakdown voltage of the semiconductor device 100 can be suppressed.

Figure 19A:
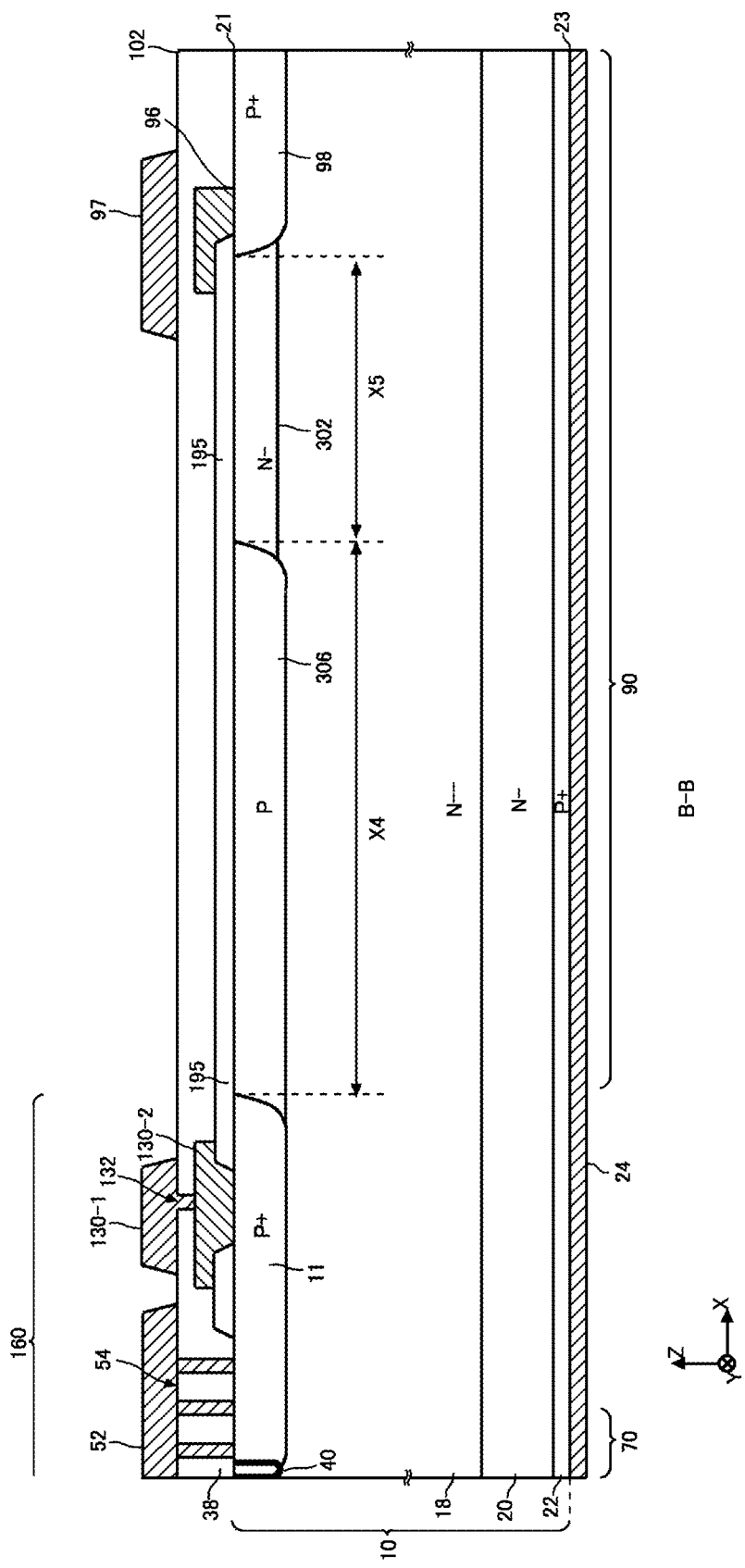
FIG. 19A shows another example of the cross section B-B.

FIG. 19A shows another example of the cross section B-B. The edge termination structure portion 90 of this example differs from those of the examples shown in FIGS. 10 to 18 in the point of including an extension region 306. In addition, the edge termination structure portion 90 of this example does not include the guard ring 92, the guard ring electrode 91, the field plate 93, and the field electrode 94. Other structures are similar to those in any of the aspects described with reference to FIGS. 10 to 18.

The extension region 306 is connected to the well region 11. The extension region 306 of this example extends toward the end side 102 of the semiconductor substrate 10 from the well region 11. A doping concentration of the extension region 306 is lower than the doping concentration of the well region 11. The doping concentration of the extension region 306 may either be higher or lower than the doping concentration of the base region 14. The extension region 306 may be formed to the same depth as the well region 11, may be formed to be shallower than the well region 11, or may be formed to be deeper than the well region 11.

The high concentration region 302 is arranged outside the extension region 306. The high concentration region 302 is in contact with the extension region 306. The high concentration region 302 of this example is provided from the extension region 306 to the channel stopper 98. Seen from the upper surface 21 of the semiconductor substrate 10, the lower end of the high concentration region 302 may be arranged at a position shallower than that of the lower end of the extension region 306. In the edge termination structure portions 90 of the respective examples described in the present specification, the drift region 18 does not need to be exposed on the upper surface 21 of the semiconductor substrate 10. A region having a higher doping concentration than the drift region 18 may be exposed on the upper surface 21 of the semiconductor substrate 10 in the edge termination structure portion 90. The dielectric film such as the dielectric film 195 and the embedded dielectric film 95 is provided above the extension region 306 and the high concentration region 302. In the edge termination structure portion 90, the dielectric film such as the dielectric film 195 and the embedded dielectric film 95 does not need to be brought into contact with the drift region 18.

The doping concentration of the extension region 306 is relatively low, and the extension region 306 is likely to be depleted. Therefore, a potential of the extension region 306 gradually changes in a direction from the well region 11 to the end side 102 of the semiconductor substrate 10. Accordingly, it becomes possible to reduce an electric field strength in the edge termination structure portion 90 and improve a breakdown voltage of the semiconductor device 100. A length X4 of the extension region 306 in the X axis direction may be larger than a length X5 of the high concentration region 302 in the X axis direction. The length X5 may be half the length X4 or less, or may be ¼ or less. In another example, the length X4 may be the same as or smaller than the length X5. The doping concentration of the extension region 306 may be higher than that of the high concentration region 302, or may be the same as that of the high concentration region 302.

As an example, the doping concentration of the extension region 306 is $1 \times 10^{15}/\text{cm}^3$ or more and $1 \times 10^{17}/\text{cm}^3$ or less. As an example, the doping concentration of the high concentration region 302 is $1 \times 10^{15}/\text{cm}^3$ or less. The doping concentrations of the extension region 306 and the high concentration region 302 may be the concentrations on the upper surface 21 of the semiconductor substrate 10, or may be the maximum concentration in each of the regions.

Figure 19B:
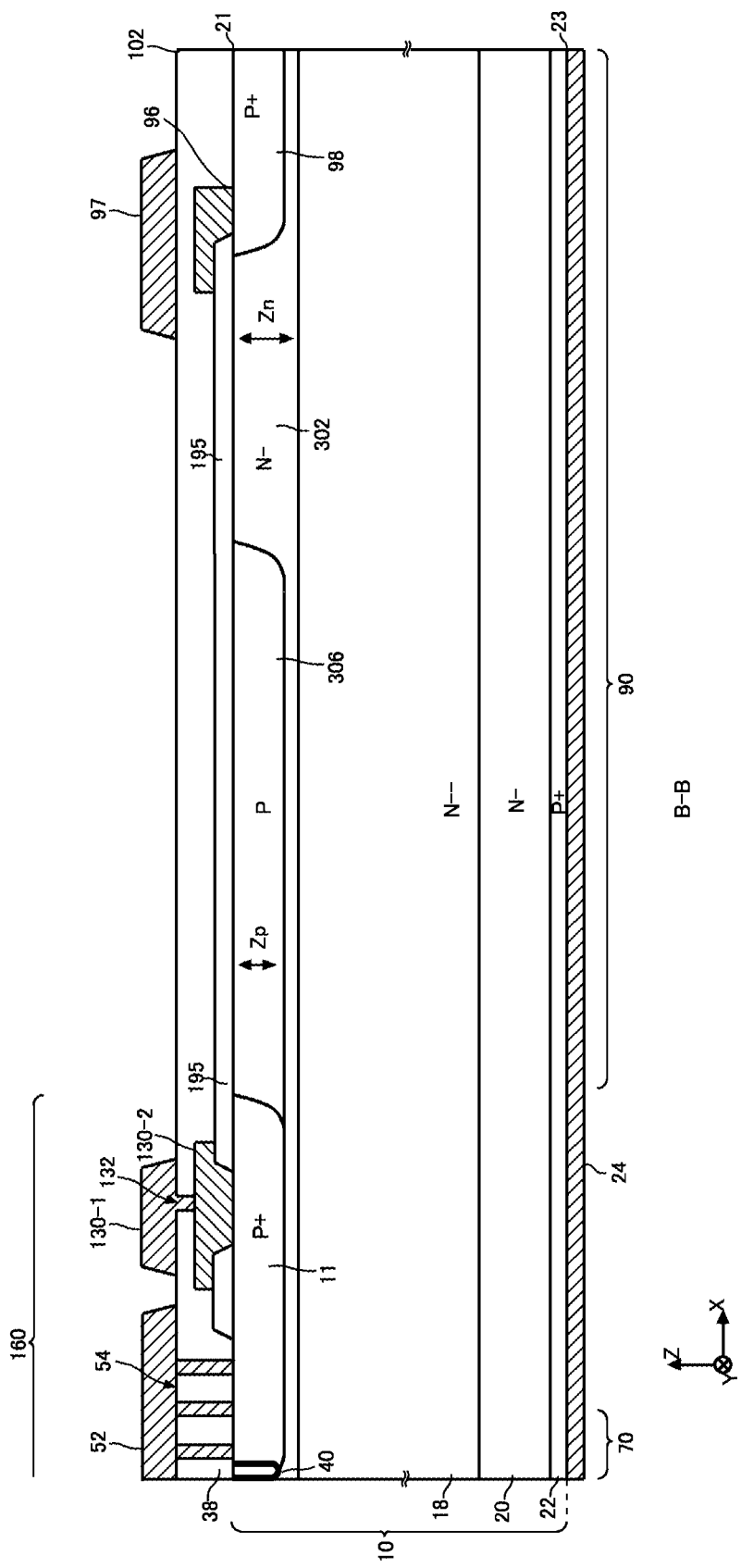
FIG. 19B shows another example of the cross section B-B.

FIG. 19B shows another example of the cross section B-B. The edge termination structure portion 90 of this example differs from that of the example shown in FIG. 19A in that, when seen from the upper surface 21, the lower end of the high concentration region 302 is arranged at a position deeper than that of the lower end of the extension region 306. That is, the high concentration region 302 of this example is provided to be deeper than the extension region 306. Other structures are similar to those of the example shown in FIG. 19A. The high concentration region 302 may also be provided between the well region 11 and the drift region 18. The high concentration region 302 may also be provided between the channel stopper 98 and the drift region 18.

A length Zn of the high concentration region 302 in the depth direction (the Z axis direction) may be 1.1 times or more, 1.5 times or more, or 2 times or more of a length Zp of the extension region 306. The length Zn is a maximum value of the length of the high concentration region 302 in the Z axis direction, and the length Zp is a maximum value of the length of the extension region 306 in the Z axis direction.

Figure 20:
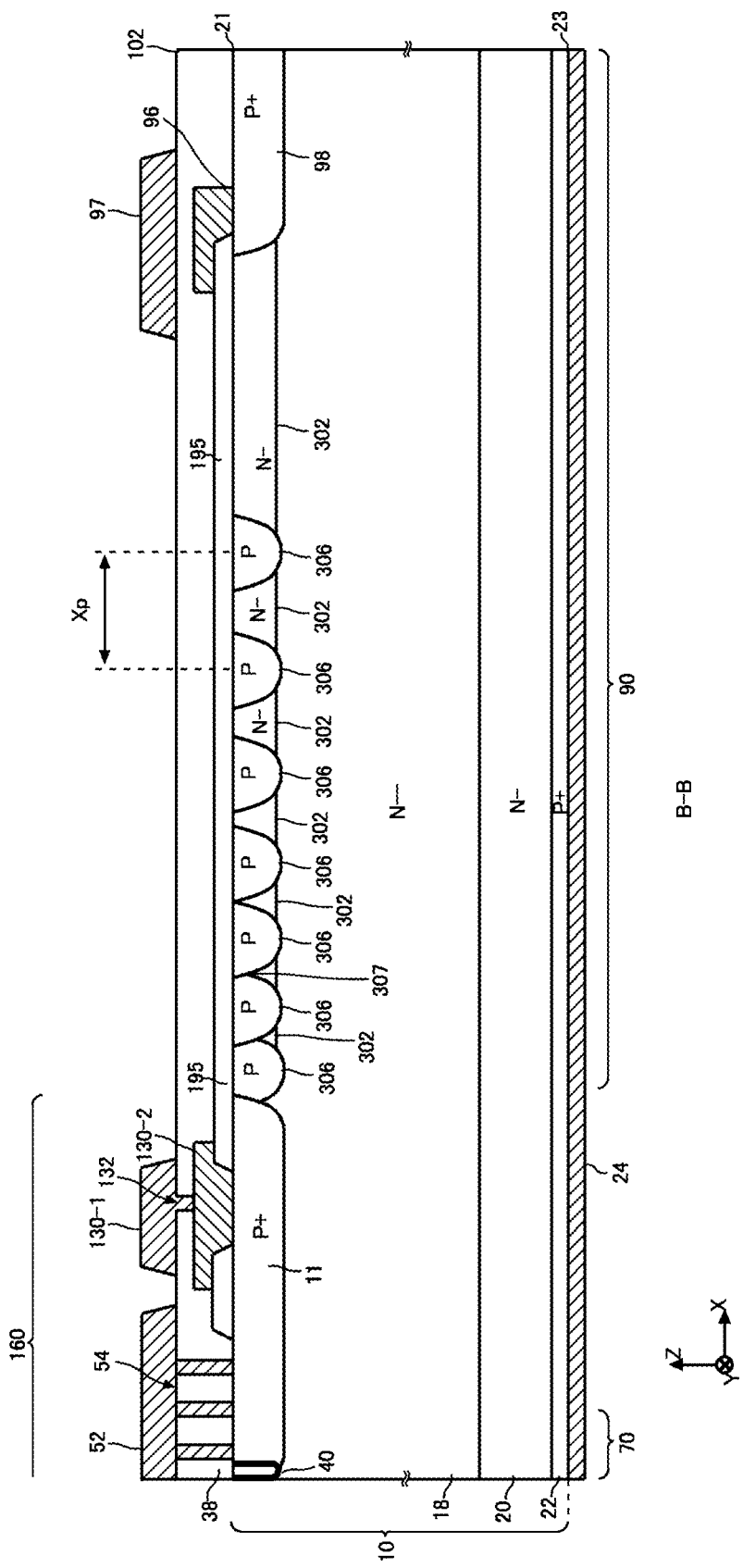
FIG. 20 shows another example of the cross section B-B.

FIG. 20 shows another example of the cross section B-B. The edge termination structure portion 90 of this example differs from that of the example shown in FIG. 19A or 19B in that a plurality of extension regions 306 are arranged from the well region 11 toward the end side 102 of the semiconductor substrate 10. Other structures are similar to those of the example shown in FIG. 19A or 19B.

Of the plurality of extension regions 306, the extension region 306 closest to the active portion 160 is connected to the well region 11. The two adjacent extension regions 306 in the X axis direction may be connected to each other or may be provided apart from each other. A distance between centers of the two adjacent extension regions 306 in the X axis direction is indicated by Xp. The distance Xp may increase as a distance from the end side 102 of the semiconductor substrate 10 decreases. The two or more extension regions 306 on the well region 11 side may be connected to each other. The two or more extension regions 306 on the end side 102 side may be provided apart from each other.

The doping concentrations of the respective extension regions 306 may mutually be the same. In another example, the doping concentrations of the extension regions 306 may decrease as the distance from the well region 11 increases. Accordingly, a potential distribution of the extension regions 306 in the X axis direction can be made moderate. Also in the examples shown in FIGS. 19A and 19B, the doping concentration of the extension region 306 may decrease as the distance from the well region 11 increases.

The high concentration region 302 is provided from the extension region 306 closest to the end side 102 to the end side 102 (or channel stopper 98). The high concentration region 302 may also be provided between the two extension regions 306 provided apart from each other. In addition, the high concentration region 302 may also be provided between the extension region 306 and the drift region 18. The high concentration region 302 may be formed to be deeper or shallower than the extension region 306.

Even when the high concentration region 302 is shallower than the extension region 306, the high concentration region 302 may be provided between the extension region 306 and the drift region 18. As shown in FIG. 20, the high concentration region 302 may be provided between a connection portion 307 between the two extension regions 306 connected to each other and the drift region 18. A thickness of the connection portion 307 from the upper surface 21 may become small in some cases. Therefore, there is a case where it is impossible to cover a range where the phosphorus concentration or the boron concentration is likely to vary with just the connection portion 307. By providing the high concentration region 302 between the connection portion 307 and the drift region 18, a region having a higher concentration than the drift region 18 can be provided in the range where the doping concentration is likely to vary.

Figure 21:
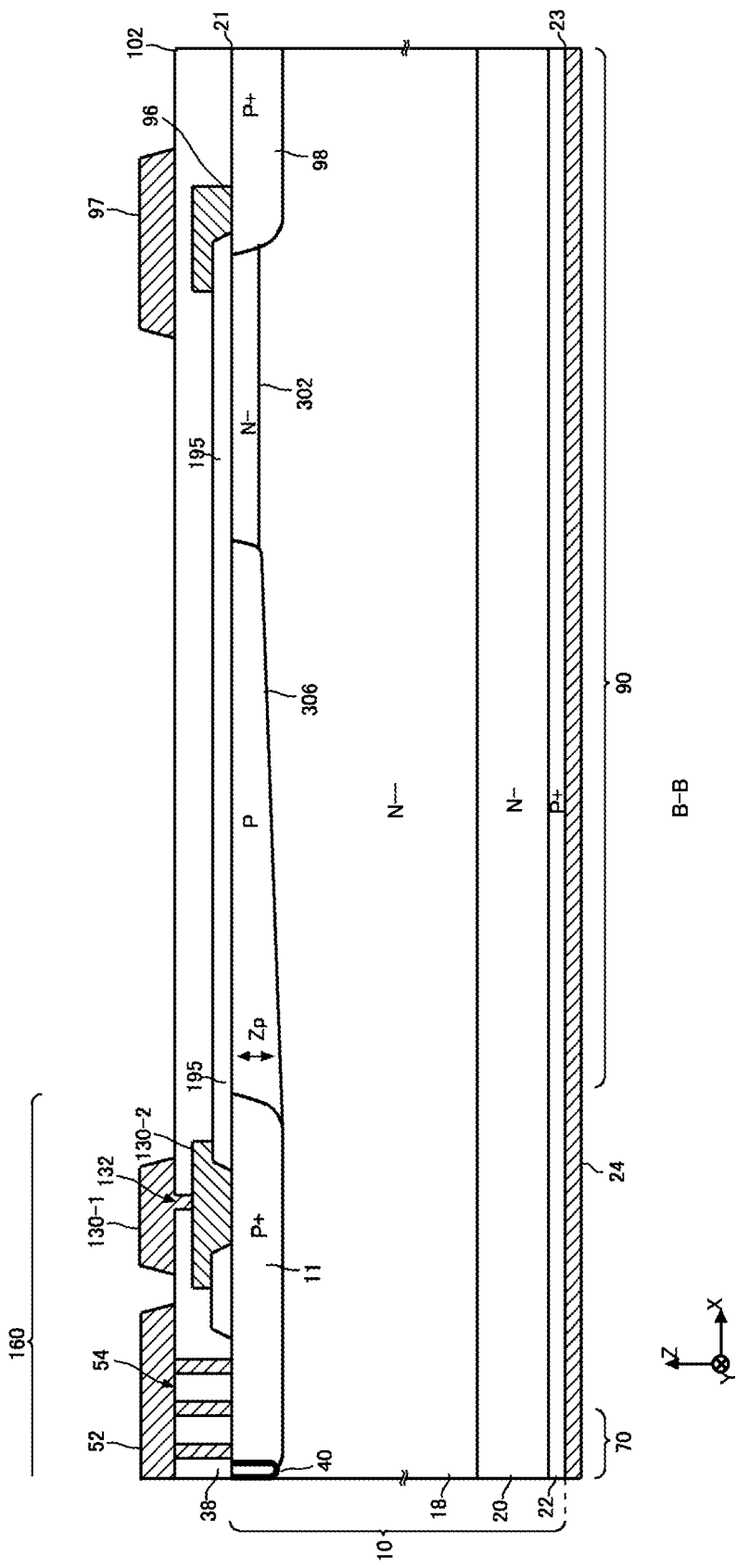
FIG. 21 shows another example of the cross section B-B.

FIG. 21 shows another example of the cross section B-B. In the edge termination structure portion 90 of this example, a thickness Zp of the extension region 306 in the depth direction becomes smaller as the distance from the well region 11 increases. Other structures are similar to those in any of the aspects described with reference to FIGS. 19A to 20. As in the example of FIG. 20, even when the plurality of extension regions 306 are arranged discretely, the thicknesses Zp of the extension regions 306 in the depth direction may become smaller as the distance from the well region 11 increases. Also in such a configuration, the potential distribution of the extension region 306 in the X axis direction can be made moderate. Also in the example of FIG. 21, the doping concentration of the extension region 306 may be constant irrespective of the distance from the well region 11, or may become smaller as the distance from the well region 11 increases. The length of the extension region 306 in the X axis direction is similar to that of the example of FIG. 19A.

The lower end of the high concentration region 302 may be arranged at a position shallower than that of the lower end of the extension region 306 when seen from the upper surface 21 of the semiconductor substrate 10. The lower end of the high concentration region 302 is a point at which the distance from the upper surface 21 becomes maximum in the high concentration region 302. The lower end of the extension region 306 is a point at which the distance from the upper surface 21 becomes maximum in the extension region 306.

Figure 22:
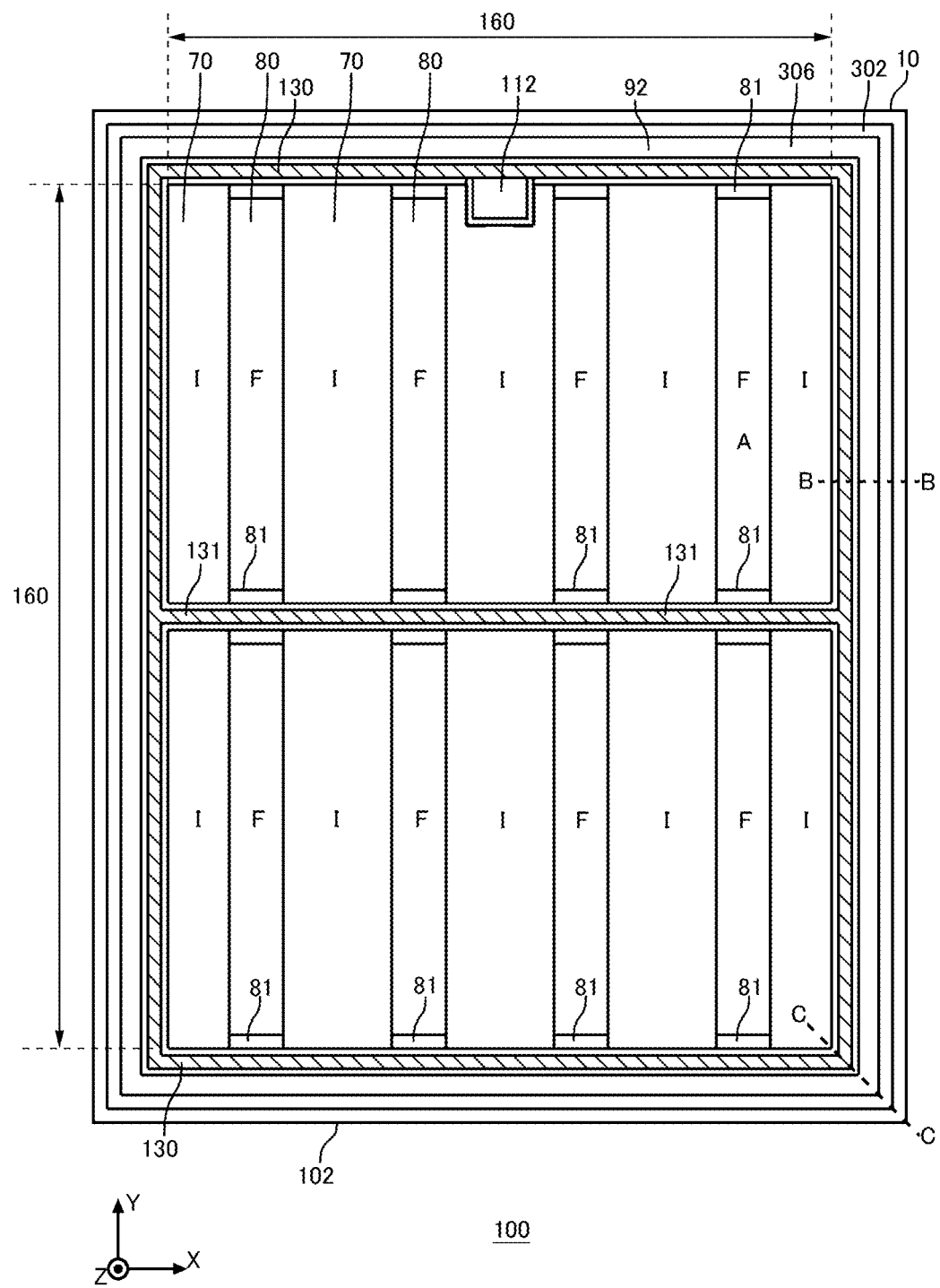
FIG. 22 shows another example of the cross section B-B.

FIG. 22 shows an exemplary arrangement of the high concentration region 302 in a top view. Although FIG. 22 shows the high concentration region 302 of the example shown in FIG. 19A, it may also be similarly adopted in other examples. The high concentration region 302 encloses the extension region 306 in a top view. The extension region 306 encloses the outer side of the active portion 160, and the high concentration region 302 encloses the outer side of the extension region 306. The outer side refers to a side closer to the end sides 102 of the semiconductor substrate 10. The channel stopper 98 is arranged on the outer side of the high concentration region 302, though an illustration is omitted in FIG. 22. When the channel stopper 98 is not provided, the high concentration region 302 may be provided to the end sides 102 of the semiconductor substrate 10.

In the respective examples described with reference to FIGS. 10 to 22, the high concentration region 302 may be formed to be deeper than the well region 11 as shown in FIG. 15, or may be formed to be shallower than the well region 11 as shown in FIG. 14. In the respective examples described with reference to FIGS. 1 to 22, the dielectric film 195 may be replaced with the embedded dielectric film 95, or the embedded dielectric film 95 may be replaced with the dielectric film 195.

Figure 23:
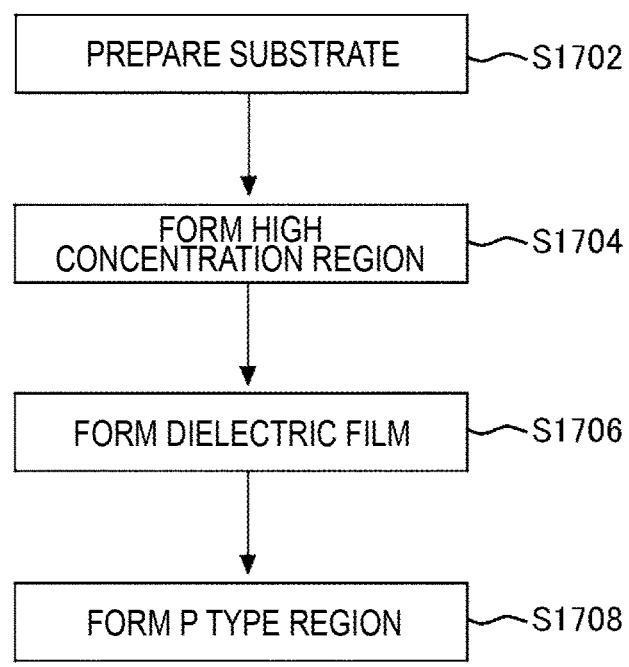
FIG. 23 shows some processes in the manufacturing method of the semiconductor device 100 including the high concentration region 302.

FIG. 23 shows some processes in the manufacturing method of the semiconductor device 100 including the high concentration region 302. In this example, in a substrate preparation step S1702, the semiconductor substrate 10 is prepared. For example, the semiconductor substrate 10 is a substrate in which both the dopant of the first conductivity type and the dopant of the second conductivity type are distributed in the entire substrate. In the present specification, the dopant of the first conductivity type that is distributed in the entire semiconductor substrate 10 may sometimes be referred to as a first dopant, and the dopant of the second conductivity type that is distributed in the entire semiconductor substrate 10 may sometimes be referred to as a second dopant. The first conductivity type may be the N type, and the second conductivity type may be the P type. The first dopant may be either one of or a plurality of elements selected from phosphorus, sulfur, antimony, hydrogen, and nitrogen. The second dopant may be either one of or a plurality of elements selected from boron, aluminum, and indium. Further, when forming the embedded dielectric films 95 as shown in FIG. 10, the recesses 232 (see FIG. 7) are formed in the semiconductor substrate 10 in the substrate preparation step S1702. A method of forming the recesses 232 is similar to the recess formation step S702 described with reference to FIG. 7.

Next, in a high concentration region formation step S1704, the high concentration region 302 is formed in at least a partial region on the upper surface 21 of the semiconductor substrate 10. In S1704, N type dopant ions such as phosphorus are selectively implanted from the upper surface 21 of the semiconductor substrate 10 to thus form the high concentration region 302. When the recess 232 is formed in the semiconductor substrate 10, the N type dopant ions such as phosphorus are implanted from a bottom surface of the recess 232. In this case, the mask 230 shown in FIG. 7 may be used as an ion implantation mask. After the N type dopant ions are implanted, the semiconductor substrate 10 may be subjected to heat treatment in S1704. In another example, the heat treatment of the semiconductor substrate 10 may be carried out in a process after S1704. The dopant of the N type dopant ions may be the same as or different from the first dopant.

Next, in a dielectric film formation step S1706, the dielectric film 195 or the embedded dielectric film 95 that is arranged in contact with the high concentration region 302 is formed on the upper surface 21 of the semiconductor substrate 10. The embedded dielectric film 95 can be formed by a method similar to that of S704 in FIG. 7. When forming the dielectric film 195, the dielectric film 195 may be formed by thermally oxidizing the entire upper surface 21 of the semiconductor substrate 10 to form an oxide film and selectively removing the oxide film. In another example, the dielectric film 195 may be formed by selectively thermally oxidizing the upper surface 21 of the semiconductor substrate 10. In S1706, the fall off region 304 (see FIG. 12) is also formed when forming the dielectric film 195 or the embedded dielectric film 95. Since the high concentration region 302 is formed, an effect on the doping concentration of the fall off region 304 can be reduced.

Next, in a P type region formation step S1708, P type regions such as the guard rings 92 are formed. A method of forming the guard rings 92 is similar to that of S706 in FIG. 7. The well region 11 and the channel stopper 98 may also be formed in S1708. Through such processes, the semiconductor device 100 can be manufactured.

In the high concentration region formation step S1704, a depth of the high concentration region 302 to be formed may be adjusted according to a thermal oxidation condition used in the dielectric film formation step S1706. The depth of the high concentration region 302 can be adjusted based on an implantation depth of the N type dopant ions and the like. The thermal oxidation condition is at least one of a thermal oxidation temperature or a thermal oxidation time length.

A degree by which boron is taken into the oxide film changes depending on the thermal oxidation condition. Therefore, a depth range in which the boron concentration fluctuates may also vary depending on the thermal oxidation condition. In the high concentration region formation step S1704, the depth of the high concentration region 302 may be adjusted so that the depth range in which the boron concentration fluctuates can be covered.

Figure 24:
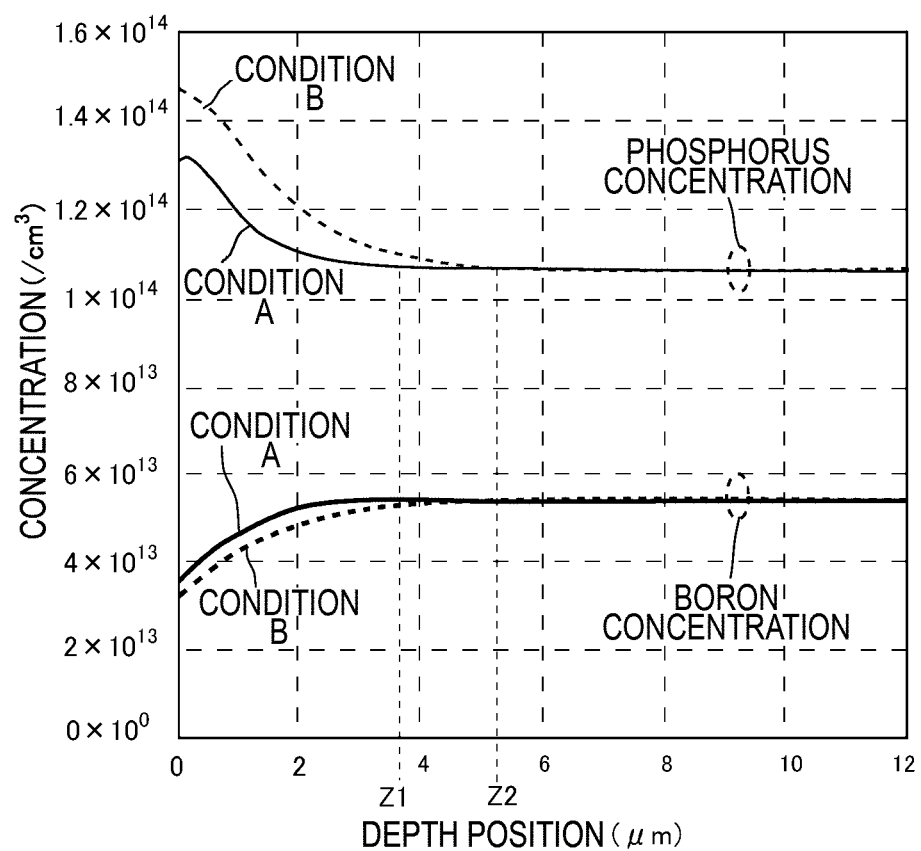
FIG. 24 shows an example of a boron concentration distribution below an oxide film.

FIG. 24 shows an example of the phosphorus concentration distribution and the boron concentration distribution below the thermally oxidized film. This example shows the phosphorous concentration distribution and the boron concentration distribution when the thermally oxidized film is formed on the upper surface of the semiconductor substrate 10 in which boron and phosphorus are uniformly distributed in the entire substrate. This example shows the respective concentration distributions under two types of thermal oxidation conditions (conditions A and B). The condition B has a higher thermal oxidation temperature and a longer thermal oxidation time than the condition A. The thermal oxidation temperature is 1000° C., and the thermal oxidation time is 115 minutes in the condition A. The thermal oxidation temperature is 1050° C., and the thermal oxidation time is 475 minutes in the condition B. The horizontal axis of FIG. 24 represents a depth position in the Z axis direction, with a boundary between the thermally oxidized film and the semiconductor substrate 10 being a reference position. As shown in FIG. 24, ranges in which the boron concentration and the phosphorus concentration change fluctuate depending on the thermal oxidation condition. Under the condition A, at least one of the boron concentration or the phosphorus concentration changes within a depth position range from 0 to Z1, and under the condition B, at least one of the boron concentration or the phosphorus concentration changes within the depth position range from 0 to Z2. The depth position Z2 is deeper than the depth position Z1.

In the high concentration region formation step S1704, the high concentration region 302 may be formed so as to cover the entire range in which at least one of the boron concentration or the phosphorus concentration changes. The high concentration region 302 may be formed to be deeper than the depth position Z1 in the case of the condition A, and the high concentration region 302 may be formed to be deeper than the depth position Z2 in the case of the condition B. Accordingly, the effect of changes of the boron concentration or the phosphorus concentration can be suppressed.

In FIG. 24, both of the thermal oxidation temperature and the thermal oxidation time are changed between the conditions A and B. Also when one of the thermal oxidation temperature or the thermal oxidation time is changed, the boron concentration distribution and the phosphorus concentration distribution changed similar to the example of FIG. 24. In the high concentration region formation step S1704, the high concentration region 302 may be formed to become deeper as the thermal oxidation temperature in the dielectric film formation step S1706 increases. In the high concentration region formation step S1704, the high concentration region 302 may be formed to become deeper as the thermal oxidation time in the dielectric film formation step S1706 becomes longer.

Figure 25:
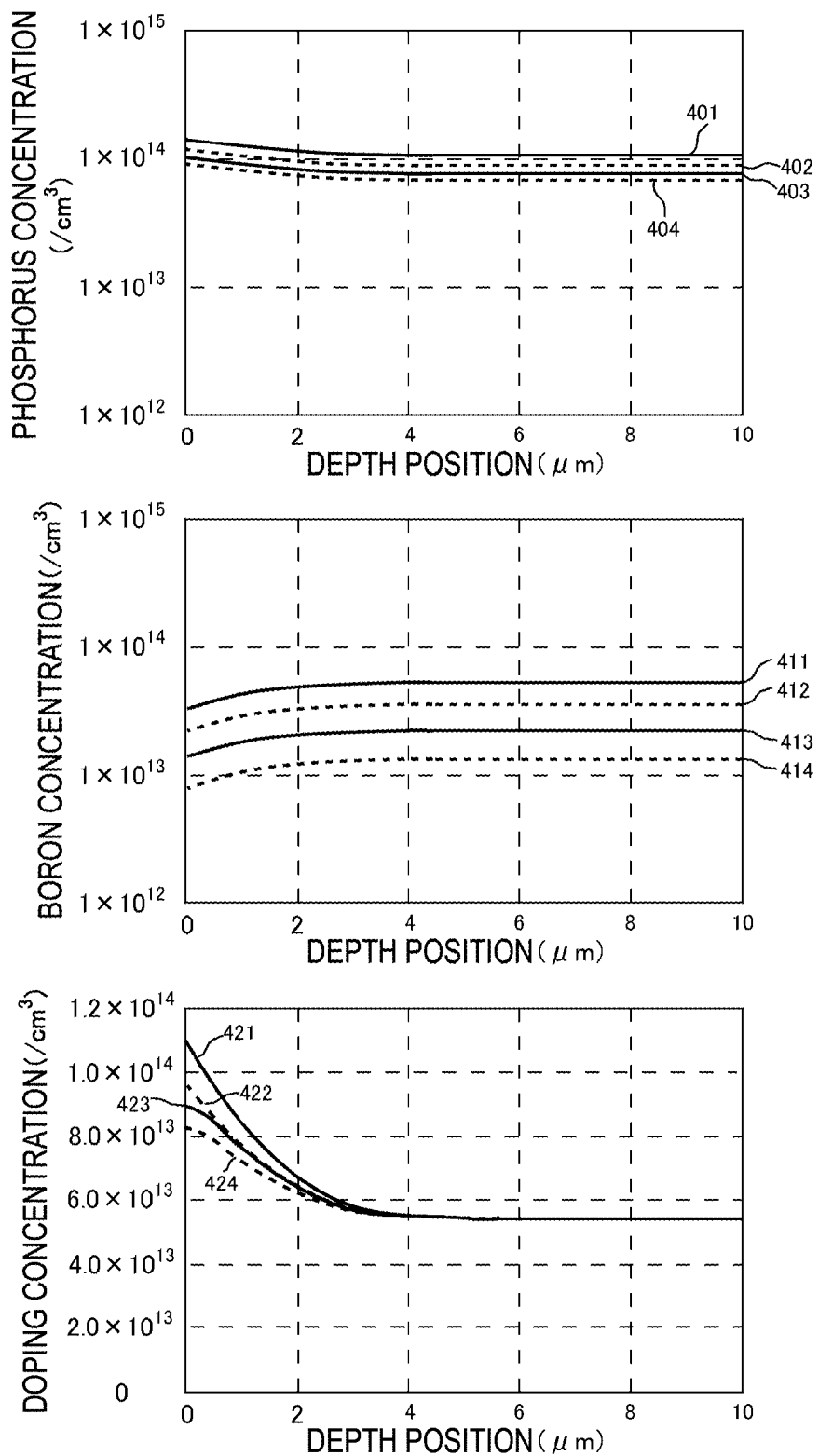
FIG. 25 shows an example of concentration distributions of a bulk donor and a bulk acceptor and a net doping concentration distribution.

FIG. 25 shows examples of the concentration distributions of the bulk donor and the bulk acceptor and the net doping concentration distribution. FIG. 25 shows distributions before the high concentration region 302 is formed. The horizontal axes of FIG. 25 each represent a distance from the lower end of the dielectric film 195 in the Z axis direction. The dopant of the first conductivity type of the high concentration region 302 may be the same element as the first dopant. The dopant of the bulk donor may be the first dopant. The dopant of the bulk acceptor may be the second dopant. In this example, the bulk donor is phosphorus, and the bulk acceptor is boron. The dopant of the first conductivity type of the high concentration region 302 may be an element different from that of the first dopant.

FIG. 25 shows four examples in which a ratio between a bulk donor concentration Nd and a bulk acceptor concentration Na differs. As described above, concentration values obtained at a center of the semiconductor substrate 10 in the depth direction may be used as the bulk donor and bulk acceptor concentrations. In the four examples, the net doping concentration distributions in the drift region 18 are the same. A phosphorus concentration distribution 401, a boron concentration distribution 411, and a doping concentration distribution 421 are examples in which Na/Nd is 0.5, a phosphorus concentration distribution 402, a boron concentration distribution 412, and a doping concentration distribution 422 are examples in which Na/Nd is 0.4, a phosphorus concentration distribution 403, a boron concentration distribution 413, and a doping concentration distribution 423 are examples in which Na/Nd is 0.3, and a phosphorus concentration distribution 404, a boron concentration distribution 414, and a doping concentration distribution 424 are examples in which Na/Nd is 0.2.

Similar to the example of FIG. 12, the phosphorus concentration increases and the boron concentration decreases toward the dielectric film 195 in any of the examples of FIG. 25. Also in any of the examples of FIG. 25, the phosphorus concentration and the boron concentration at the boundary with the dielectric film 195 fluctuate generally about 30% with respect to the respective concentrations in the drift region 18. Since the boron concentration decreases in the vicinity of the dielectric film 195, the net doping concentration becomes closer to the phosphorus concentration as the distance from the dielectric film 195 decreases.

A difference between the bulk donor concentration Nd and the bulk acceptor concentration Na is referred to as bulk net doping concentration Nnet. That is, the bulk net doping concentration Nnet is expressed by the following expression.

$$Nnet = Nd - Na \quad \text{Expression 1a}$$

In addition, when Na/Nd is represented by α, Expression 1a is modified into the following expression.

$$Nnet = (1-\alpha)Nd = (1/\alpha - 1)Na \quad \text{Expression 1b}$$

Note that Nd>Na and α<1 in this example.

The donor concentration and acceptor concentration at the boundary with the dielectric film 195 are represented by Nd_s and Na_s, respectively. The net doping concentration Nnet_s at the boundary with the dielectric film 195 is obtained by the following expression.

$$Nnet\_s = Nd\_s - Na\_s \quad \text{Expression 2}$$

In each of the examples shown in FIG. 25, the acceptor concentration Na_s is 58% to 62% of the bulk acceptor concentration Na. Here, Na_s=0.6Na. In addition, since Na_s=0.6αNd based on Na/Nd=α, Expression 2 becomes the following expression.

$$Nnet\_s = Nd\_s - 0.6\alpha Nd \quad \text{Expression 3}$$

In addition, the doner concentration Nd_s is expressed as in the following expression.

$$Nd\_s = \beta Nd \quad \text{Expression 4}$$

In each of the examples shown in FIG. 25, since the doner concentration Nd_s at the boundary becomes 130% to 140% of the bulk donor concentration Nd, β is 1.3 to 1.4. Here, β=1.35.

Expression 3 can be modified as follows based on Expression 4.

$$Nnet\_s = Nd\_s - 0.6\alpha Nd = 1.35 Nd - 0.6\alpha Nd = (1.35 - 0.6\alpha)Nd \quad \text{Expression 5}$$

In addition, Expression 5 can be modified as follows based on Expression 1b.

$$Nnet\_s = (1.35 - 0.6\alpha)Nd = (1.35 - 0.6\alpha)(1/(1-\alpha))Nnet \quad \text{Expression 6}$$

As in Expression 6, the net doping concentration in the vicinity of the oxide film when the semiconductor substrate 10, in which the bulk donor and the bulk acceptor exist, is oxidized can be expressed by using the bulk net doping concentration Nnet and the ratio α between the bulk acceptor concentration and donor concentration.

In addition, the net doping concentration on the front surface of the high concentration region 302, that is, at a boundary with the dielectric film 195, when the high concentration region 302 is formed is represented by NF_s. If the concentration NF_s is sufficiently large with respect to the concentration Nnet_s, it becomes possible to less likely be affected by the fluctuation of the acceptor concentration and the donor concentration in the fall off region 304 (see FIG. 12). That is, the concentration NF_s preferably satisfies the following expression.

$$NF\_s \geq \gamma Nnet\_s \quad \text{Expression 7}$$

Here, γ is a value larger than 1. As an example, γ may be 2 or more, 5 or more, or 7 or more. Furthermore, γ may be 50 or less, 30 or less, or 20 or less. γ in this example is 10.

Substituting Expression 6 into Expression 7, the following expression is obtained.

$$NF\_s \geq \gamma(1.35 - 0.6\alpha)(1/(1-\alpha)) \quad Nnet \text{ Expression 8}$$

It is preferable for the net doping concentration NF_s on the front surface of the high concentration region 302 to satisfy Expression 8.

Figure 26:
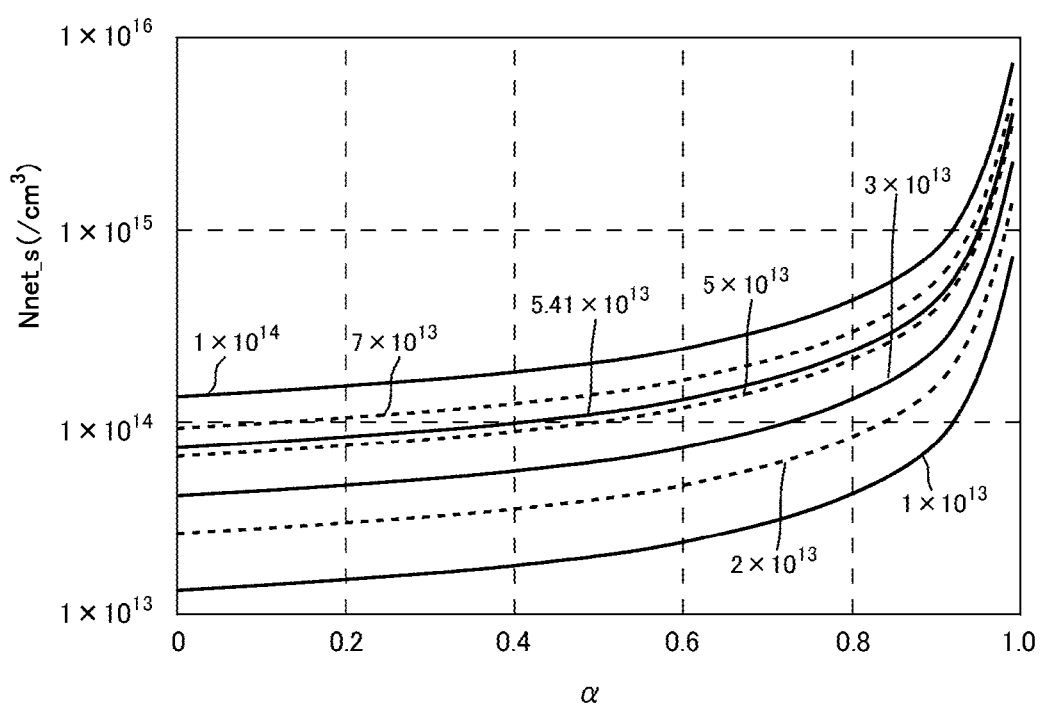
FIG. 26 shows a relationship between a concentration Nnet_s and α.

FIG. 26 shows a relationship between the concentration Nnet_s and α. FIG. 26 shows respective examples in which the bulk net doping concentration Nnet is $1\times10^{13}/cm^3$, $2\times10^{13}/cm^3$, $3\times10^{13}/cm^3$, $5\times10^{13}/cm^3$, $5.41\times10^{13}/cm^3$, $7\times10^{13}/cm^3$, and $1\times10^{14}/cm^3$. When the bulk acceptor concentration Na becomes large and α approaches 1, a decrease amount of the acceptor concentration in the fall off region 304 also becomes large, and thus the concentration Nnet_s becomes large. An effect of stabilizing the breakdown voltage can be exerted in a region where the concentration Nnet_s has less changes with respect to α and shows a stable value. Thus, α may be 0.7 or less, 0.6 or less, 0.5 or less, or 0.4 or less. On the other hand, by setting the concentration Nnet_s to be relatively high, the breakdown voltage can be stabilized. Thus, α may be 0.01 or more, 0.05 or more, 0.1 or more, 0.2 or more, or 0.3 or more.

Figure 27:
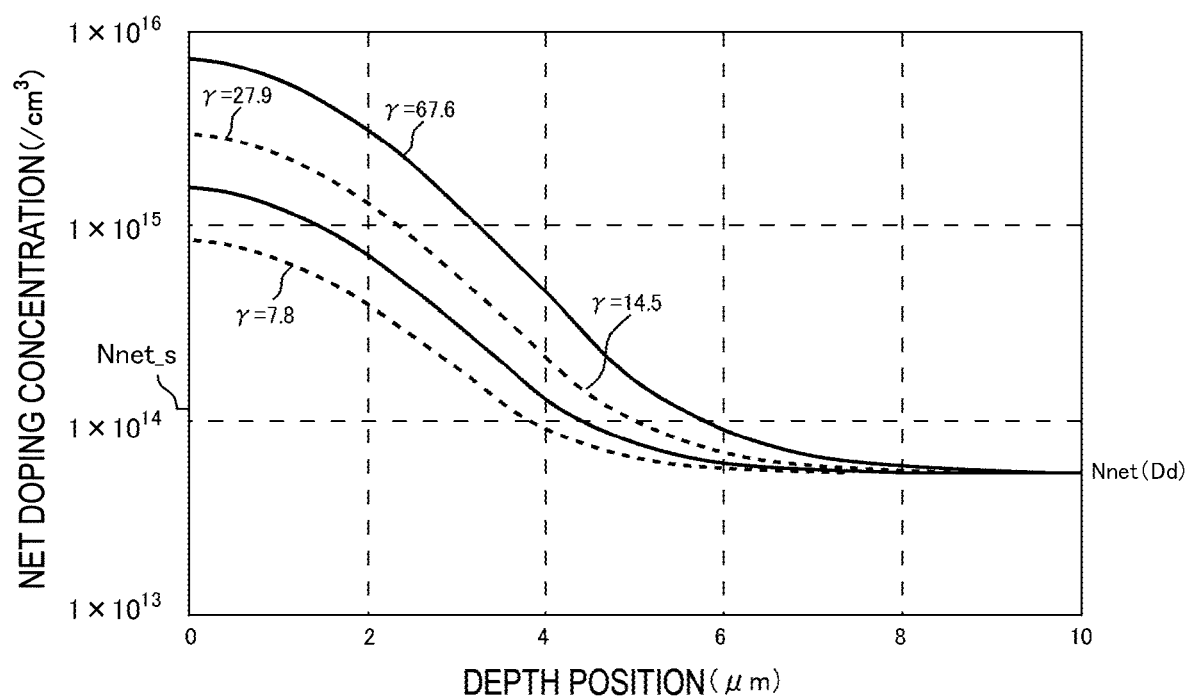
FIG. 27 shows examples of the net doping concentration distribution in the high concentration region 302.

FIG. 27 shows examples of the net doping concentration distribution in the high concentration region 302. The horizontal axis of FIG. 27 represents the distance from the lower end of the dielectric film 195. FIG. 27 shows four examples in which γ=7.8, 14.5, 27.9, and 67.6. Note that in each of the examples, α=0.5, and Nnet=$5.41\times10^{13}/cm^3$. Note that the concentration Nnet_s can be determined from FIG. 26.

Of the examples shown in FIG. 27, in the case of γ=67.6, the net doping concentration NF_s at the upper end (depth position 0 μm) of the high concentration region 302 becomes too large, and the breakdown voltage decreases. As described above, γ may be 50 or less.

In the examples described above, the net doping concentration Dd in the drift region 18, that has been measured by the SRP method, may be used as the bulk net doping concentration Nnet. In addition, the bulk net doping concentration Nnet may be calculated from a difference between the bulk donor concentration Nd and the bulk acceptor concentration Na that have been measured by the SIMS method. As described above, values obtained at the center of the semiconductor substrate 10 may be used as the net doping concentration Dd, the bulk donor concentration Nd, and the bulk acceptor concentration Na.

As described above, by forming the high concentration region 302, it becomes possible to reduce variations in the net doping concentration of the semiconductor substrate below the embedded dielectric film 95 or the dielectric film 195. Accordingly, it becomes possible to suppress, when the depletion layer expands across the high concentration region 302 (the X axis direction), variations of a spreading width of the depletion layer. Accordingly, it becomes possible to suppress variations in characteristics in the semiconductor device to which the semiconductor substrate, in which both the dopant of the first conductivity type and the dopant of the second conductivity type are distributed in the entire semiconductor substrate and the concentration of the dopant of the second conductivity type decreases toward the dielectric film, is applied.

While the embodiments of the present invention have been described, the technical scope of the invention is not limited to the above described embodiments. It is apparent to persons skilled in the art that various alterations or improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device, comprising:
a semiconductor substrate having a first dopant of a first conductivity type and a second dopant of a second conductivity type, the second dopant having a lower concentration than the first dopant, both the first dopant and the second dopant being distributed in an entire part of the semiconductor substrate, the semiconductor substrate including a drift region of the first conductivity type;
a dielectric film provided at an upper surface of the semiconductor substrate;
a high concentration region of the first conductivity type provided in contact with the dielectric film below the dielectric film and having a higher doping concentration than the drift region; and
a fall off region that is provided in contact with the dielectric film below the dielectric film and in which a concentration of the second dopant decreases toward the dielectric film, wherein
the first dopant is phosphorus or antimony and the first dopant is provided as a bulk donor having a substantially uniform distribution within the drift region.

2. The semiconductor device according to claim 1, wherein
a difference between a maximum value and a minimum value of a concentration of a dopant of the first conductivity type in the high concentration region is larger than a difference between a maximum value and a minimum value of the concentration of the second dopant in the fall off region.

3. The semiconductor device according to claim 1, wherein
the high concentration region is provided in contact with the drift region and the concentration of the second dopant decreases toward the dielectric film inside a portion of the high concentration region in contact with the dielectric film to form the fall off region.

4. The semiconductor device according to claim 1, wherein
a maximum value of a net doping concentration of the high concentration region is 10 times a net doping concentration of the drift region or more.

5. The semiconductor device according to claim 1, wherein
a maximum value of a net doping concentration of the high concentration region is $1\times10^{14}/cm^3$ or more.

6. The semiconductor device according to claim 1, comprising:
an active portion in the semiconductor substrate, the active portion being provided with at least one of a transistor portion or a diode portion; and
an edge termination structure portion in the semiconductor substrate, the edge termination structure portion being provided outside the active portion,
wherein the high concentration region and the fall off region are formed in the edge termination structure portion.

7. The semiconductor device according to claim 6, wherein
the edge termination structure portion includes a plurality of guard rings of the second conductivity type that are provided in contact with the upper surface of the semiconductor substrate,
the high concentration region is arranged between two of the plurality of guard rings,
the dielectric film is arranged between the two of the plurality of guard rings, and
a lower end of the high concentration region is arranged closer to an upper surface side of the semiconductor substrate than to lower ends of the plurality of guard rings.

8. The semiconductor device according to claim 6, wherein
the edge termination structure portion includes a plurality of guard rings of the second conductivity type that are provided in contact with the upper surface of the semiconductor substrate,
the high concentration region is arranged between two of the plurality of guard rings,
the dielectric film is arranged between the two of the plurality of guard rings, and
a lower end of the high concentration region is arranged closer to a lower surface side of the semiconductor substrate than to lower ends of the plurality of guard rings.

9. The semiconductor device according to claim 6, wherein
the dielectric film is at least partially embedded inside the semiconductor substrate.

10. The semiconductor device according to claim 9, wherein
a depth from the upper surface of the semiconductor substrate to a lower end of the dielectric film is 0.3 μm or more.

11. The semiconductor device according to claim 9, wherein
a depth from the upper surface of the semiconductor substrate to a lower end of the dielectric film is 2 μm or more.

12. The semiconductor device according to claim 9, wherein
the dielectric film includes:
a first dielectric film; and
a second dielectric film laminated on the first dielectric film.

13. The semiconductor device according to claim 7, further comprising:
a field plate provided from above the plurality of guard rings to above the dielectric film and formed of polysilicon,
wherein the field plate includes:
a valley portion recessed toward the upper surface of the semiconductor substrate at a position where the field plate overlaps with the dielectric film; and
an extension portion extending more toward a center of the dielectric film than toward the valley portion.

14. The semiconductor device according to claim 1, wherein
a net doping concentration NF_s ($/cm^3$) at a boundary between the high concentration region and the dielectric film satisfies a following expression:

$$NF\_s \geq \gamma(1.35-0.6\alpha)(1/(1-\alpha))Nnet$$

where γ is a real number of 2 or more, α is a ratio Na/Nd between a bulk acceptor concentration Na ($/cm^3$) and a bulk donor concentration Nd (/cm$^3$), and Nnet is a bulk net doping concentration (/cm$^3$).

15. The semiconductor device according to claim 14, wherein the α is 0.7 or less.

16. The semiconductor device according to claim 1, comprising:
a plurality of guard rings of the second conductivity type that are provided in contact with the upper surface of the semiconductor substrate; and
an embedded dielectric film arranged between two of the plurality of guard rings and at least partially embedded inside the semiconductor substrate,
wherein
the high concentration region is arranged between the two of the plurality of guard rings,
the dielectric film is arranged between the two of the plurality of guard rings,
a lower end of the high concentration region is arranged closer to an upper surface side of the semiconductor substrate than to lower ends of the plurality of guard rings, and
the plurality of guard rings are provided up to below the embedded dielectric film.

17. The semiconductor device according to claim 1, comprising:
a plurality of guard rings of the second conductivity type that are provided in contact with the upper surface of the semiconductor substrate; and
an embedded dielectric film arranged between two of the plurality of guard rings and at least partially embedded inside the semiconductor substrate,
wherein
the high concentration region is arranged between the two of the plurality of guard rings,
the dielectric film is arranged between the two of the plurality of guard rings,
a lower end of the high concentration region is arranged closer to a lower surface side of the semiconductor substrate than to lower ends of the plurality of guard rings, and
the plurality of guard rings are provided up to below the embedded dielectric film.

18. The semiconductor device according to claim 6, wherein
the active portion includes a well region of the second conductivity type arranged at a boundary with the edge termination structure portion,
the edge termination structure portion is provided with an extension region of the second conductivity type connected to the well region and having a lower doping concentration than the well region, and
the high concentration region is arranged outside the extension region.

19. The semiconductor device according to claim 18, wherein
a lower end of the high concentration region is arranged at a position deeper than that of a lower end of the extension region when seen from the upper surface of the semiconductor substrate.

20. The semiconductor device according to claim 19, wherein
the high concentration region is provided also between the extension region and the drift region.

21. The semiconductor device according to claim 19, wherein
the high concentration region is provided also between the well region and the drift region.

22. The semiconductor device according to claim 18, wherein
a lower end of the high concentration region is arranged at a position shallower than that of a lower end of the extension region when seen from the upper surface of the semiconductor substrate.

23. The semiconductor device according to claim 18, wherein
the doping concentration of the extension region is lower as the extension region is farther away from the well region.

24. A manufacturing method of a semiconductor device, comprising:
preparing a semiconductor substrate having a first dopant of a first conductivity type and a second dopant of a second conductivity type, both the first dopant and the second dopant being distributed in an entire part of the semiconductor substrate, the semiconductor substrate including a drift region of the first conductivity type;
forming, in at least a partial region of an upper surface of the semiconductor substrate, a high concentration region having a dopant of the first conductivity type, the high concentration region having a higher doping concentration than the drift region; and
forming a dielectric film arranged in contact with the high concentration region at the upper surface of the semiconductor substrate and a fall off region that is in contact with the dielectric film below the dielectric film and in which a concentration of a dopant of the second conductivity type decreases toward the dielectric film.

25. The manufacturing method according to claim 24, wherein
the forming of the dielectric film forms the dielectric film by thermal oxidation, and
a depth of the high concentration region formed in the forming of the high concentration region is adjusted according to a thermal oxidation condition in the forming of the dielectric film.

26. The semiconductor device according to claim 1, wherein
the first dopant and a dopant of the first conductivity type in the high concentration region are same elements.

27. The manufacturing method according to claim 24, wherein
the first dopant and the dopant of the first conductivity type in the high concentration region are same elements.

28. The semiconductor device according to claim 1, wherein
the first dopant and a dopant of the first conductivity type in the high concentration region are different elements.

29. The manufacturing method according to claim 24, wherein
the first dopant and the dopant of the first conductivity type in the high concentration region are different elements.

* * * * *